(12) United States Patent
Tazzoli et al.

(10) Patent No.: US 11,102,882 B2
(45) Date of Patent: Aug. 24, 2021

(54) PCB OPTICAL ISOLATION BY NONUNIFORM CATCH PAD STACK

(71) Applicant: Waymo LLC, Mountain View, CA (US)

(72) Inventors: Augusto Tazzoli, San Jose, CA (US); Blaise Gassend, East Palo Alto, CA (US)

(73) Assignee: Waymo LLC, Mountain View, CA (US)

( * ) Notice: Subject to any disclaimer, the term of this patent is extended or adjusted under 35 U.S.C. 154(b) by 0 days.

(21) Appl. No.: 16/204,882

(22) Filed: Nov. 29, 2018

(65) Prior Publication Data

US 2019/0174624 A1    Jun. 6, 2019

Related U.S. Application Data

(63) Continuation of application No. 15/613,580, filed on Jun. 5, 2017, now Pat. No. 10,178,764.

(51) Int. Cl.
*H05K 1/02* (2006.01)
*H05K 1/11* (2006.01)
(Continued)

(52) U.S. Cl.
CPC .......... *H05K 1/0274* (2013.01); *G01S 7/4813* (2013.01); *G01S 17/42* (2013.01);
(Continued)

(58) Field of Classification Search
CPC .. H05K 1/00; H05K 1/02; H05K 1/04; H05K 1/11; H05K 1/113; H05K 1/0274;
(Continued)

(56) References Cited

U.S. PATENT DOCUMENTS

| 6,219,258 B1 * | 4/2001 | Denzene ............ H01R 13/5219 174/358 |
| 7,705,695 B2 | 4/2010 | Kushta |

(Continued)

FOREIGN PATENT DOCUMENTS

| JP | 2002280740 | 9/2002 |
| JP | 2006108434 | 4/2006 |

(Continued)

OTHER PUBLICATIONS

International Searching Authority, International Preliminary Report on Patentability dated Dec. 10, 2019, issued in connection with International Application No. PCT/US2018/033790, filed on May 22, 2018, 5 pages.

(Continued)

*Primary Examiner* — Tuan T Dinh
(74) *Attorney, Agent, or Firm* — McDonnell Boehnen Hulbert & Berghoff LLP

(57) ABSTRACT

A Printed Circuit Board (PCB) includes a via extending through at least one layer of the PCB. The PCB may also include a first catch pad connected to the via and located within a first metal layer of the PCB. The first catch pad may have a first size. The PCB may further include a second catch pad connected to the via and located within a second metal layer of the PCB. The second catch pad may have a second size greater than the first size. The second catch pad may overlap horizontally with a portion of a metallic feature in the first metal layer to obstruct light incident on a first side of the PCB from transmission to a second side of the PCB through a region of dielectric material near the via.

20 Claims, 10 Drawing Sheets

(51) Int. Cl.
 *G01S 17/42* (2006.01)
 *G01S 7/481* (2006.01)
 *G01S 17/931* (2020.01)

(52) U.S. Cl.
 CPC ............ *G01S 17/931* (2020.01); *H05K 1/113* (2013.01); *H05K 2201/094* (2013.01); *H05K 2201/10151* (2013.01); *H05K 2203/107* (2013.01)

(58) Field of Classification Search
 CPC ..... H05K 2201/1015; H05K 2201/094; H05K 7/10; H05K 7/20; G01S 7/4972; H01P 1/203; H01P 1/2039; H04R 19/00; H04R 19/04; H04R 31/00; H04R 17/00; H04R 17/005; B81B 7/00; B81B 7/02
 USPC ................ 361/752, 760–784, 803, 816, 818, 361/699–710
 See application file for complete search history.

(56) References Cited

U.S. PATENT DOCUMENTS

| | | | |
|---|---|---|---|
| 8,384,097 B2 * | 2/2013 | Yan | F21K 9/00 257/666 |
| 8,809,974 B2 * | 8/2014 | Lo | B81B 7/0061 257/416 |
| 9,482,833 B1 | 11/2016 | Mann et al. | |
| 9,507,143 B2 | 11/2016 | Abele et al. | |
| 2005/0030231 A1 | 2/2005 | Nagaishi et al. | |
| 2005/0195051 A1 | 9/2005 | McKinzie, III | |
| 2005/0199900 A1 * | 9/2005 | Lin | H01L 33/60 257/99 |
| 2005/0225382 A1 | 10/2005 | Miller | |
| 2007/0205492 A1 * | 9/2007 | Wang | B81C 1/0023 257/659 |
| 2007/0230150 A1 * | 10/2007 | Castriotta | H01L 23/50 361/794 |
| 2008/0164053 A1 | 7/2008 | Matsubara et al. | |
| 2009/0078451 A1 * | 3/2009 | Niki | H05K 3/4682 174/250 |
| 2009/0230487 A1 * | 9/2009 | Saitoh | B81C 1/00333 257/419 |
| 2011/0067915 A1 | 3/2011 | Kim et al. | |
| 2011/0114840 A1 * | 5/2011 | Yamazaki | G01J 5/045 250/338.1 |
| 2012/0106085 A1 * | 5/2012 | Yamazaki | G01J 5/029 361/705 |
| 2012/0298872 A1 | 11/2012 | Tang et al. | |
| 2013/0099876 A1 | 4/2013 | Kushta | |
| 2013/0126702 A1 | 5/2013 | Tsukagoshi et al. | |
| 2013/0215584 A1 * | 8/2013 | Klein | H05K 3/10 361/760 |
| 2014/0045290 A1 * | 2/2014 | Horimoto | H01L 21/304 438/51 |
| 2014/0264410 A1 * | 9/2014 | Lin | H01L 25/167 257/98 |
| 2015/0236064 A1 | 8/2015 | Chen et al. | |
| 2016/0282453 A1 | 9/2016 | Pennecot et al. | |
| 2017/0040374 A1 | 2/2017 | Oh et al. | |
| 2017/0090129 A1 | 3/2017 | Mann et al. | |

FOREIGN PATENT DOCUMENTS

| | | |
|---|---|---|
| JP | 2008507858 | 3/2008 |
| JP | 2009206495 | 9/2009 |
| KR | 20130015661 | 2/2013 |
| WO | 2011/010393 | 1/2011 |
| WO | 2013/093976 | 6/2013 |

OTHER PUBLICATIONS

International Searching Authority, International Search Report and the Written Opinion of the International Searching Authority dated Sep. 14, 2018, issued in connection with International Application No. PCT/US2018/033790, filed on May 22, 2018, 7 pages.

European Patent Office, Extended European Search Report dated Nov. 24, 2020, issued in connection with European Patent Application 18814037.0, 10 pages.

Japanese Patent Office, Office Action dated Dec. 18, 2020, issued in connection with Japanese Patent Application No. 2019-558675, with English translation, 10 pages.

\* cited by examiner

PCB OPTICAL ISOLATION BY NONUNIFORM CATCH PAD STACK

CROSS REFERENCE TO RELATED APPLICATION

The present application claims priority to U.S. patent application Ser. No. 15/613,580 filed on Jun. 5, 2017 and entitled "PCB Optical Isolation By Nonuniform Catch Pad Stack," which is herein incorporated by reference as if fully set forth in this description.

BACKGROUND

A Printed Circuit Board (PCB) mechanically supports and electrically connects electronic components by way of conductive tracks, pads, vias, and other metallic features disposed on (i.e., above or beneath) and between a non-conductive substrate. Components such as resistors, capacitors, and active semiconductor devices are generally soldered to the PCB, but may also be embedded directly in the substrate. A PCB can be single sided (i.e., including only one metal layer), double sided (i.e., including two metal layers), or multi-layered (i.e., including multiple metal layers). Metallic features in different metal layers of the PCB may be electrically connected by way of vias.

SUMMARY

In an example embodiment, a Printed Circuit Board (PCB) may have non-uniformly sized via catch pads that overlap with or interpose between metallic features in adjacent metal layers of the PCB. The non-uniformly sized via catch pads may thus provide an obstruction to the transmission of light through otherwise transmissive dielectric regions of the PCB around the via. The overlap or interposition allows the two sides of the PCB to be optically isolated from each other. Thus, components mounted on a first side of the PCB can be isolated from light and other electromagnetic radiation incident on a second side of the PCB, and vice versa.

In a first embodiment, a Printed Circuit Board (PCB) is provided that includes a via extending through at least one layer of the PCB. The PCB also includes a first catch pad connected to the via and located within a first metal layer of the PCB. The first catch pad has a first size. The PCB further includes a second catch pad connected to the via and located within a second metal layer of the PCB. The second catch pad has a second size greater than the first size. Additionally, the second catch pad overlaps horizontally with a portion of a metallic feature in the first metal layer to obstruct light incident on a first side of the PCB from transmission to a second side of the PCB through a region of dielectric material near the via.

In a second embodiment, a method of manufacturing a Printed Circuit Board (PCB) is provided that includes providing a PCB substrate. The method also includes creating a first metal layer on the PCB substrate. The first metal layer includes a first catch pad for a via. The first catch pad has a first size. The method additionally includes creating a second metal layer on the PCB substrate. The second metal layer includes a second catch pad for the via. The second catch pad has a second size greater than the first size. The second catch pad overlaps horizontally with a portion of a metallic feature in the first metal layer to obstruct light incident on a first side of the PCB from transmission to a second side of the PCB through a region of the PCB substrate near the via. The method further includes creating the via. The via electrically connects the first catch pad to the second catch pad.

In a third embodiment, a system is provided that includes a Printed Circuit Board (PCB) including a first side and a second side. The system also includes a light sensor connected to the second side of the PCB and configured to sense light incident on the light sensor from the second side of the PCB. The system additionally includes a via extending through at least one layer of the PCB. The system further includes a first catch pad connected to the via and located within a first metal layer of the PCB. The first catch pad has a first size. The system yet further includes a second catch pad connected to the via and located within a second metal layer of the PCB. The second catch pad has a second size greater than the first size. The second catch pad overlaps horizontally with a portion of a metallic feature in the first metal layer to obstruct light incident on the first side of the PCB from transmission to the second side of the PCB through a region of transmissive PCB material near the via and striking the light sensor.

In a fourth embodiment, a device is provided formed by a process that includes providing a Printed Circuit Board (PCB) substrate. The process also includes creating a first metal layer on the PCB substrate. The first metal layer includes a first catch pad for a via. The first catch pad has a first size. The process additionally includes creating a second metal layer on the PCB substrate. The second metal layer includes a second catch pad for the via. The second catch pad has a second size greater than the first size. The second catch pad overlaps horizontally with a portion of a metallic feature in the first metal layer to obstruct light incident on a first side of the PCB from transmission to a second side of the PCB through a region of the PCB substrate near the via. The process further includes creating the via. The via electrically connects the first catch pad to the second catch pad.

In a fifth embodiment, an integrated circuit (IC) device is provided that includes a via extending through at least one layer of the IC device. The IC device also includes a first catch pad connected to the via and located within a first metal layer of the IC device. The first catch pad has a first size. The IC device further includes a second catch pad connected to the via and located within a second metal layer of the IC device. The second catch pad has a second size greater than the first size. Additionally, the second catch pad overlaps horizontally with a portion of a metallic feature in the first metal layer to obstruct light incident on a first side of the IC device from transmission to a second side of the IC device through a region of transmissive material near the via.

In a sixth embodiment, a method of manufacturing an integrated circuit (IC) device is provided that includes providing an IC substrate. The method also includes creating a first metal layer on the IC substrate. The first metal layer includes a first catch pad for a via. The first catch pad has a first size. The method additionally includes creating a second metal layer on the IC substrate. The second metal layer includes a second catch pad for the via. The second catch pad has a second size greater than the first size. The second catch pad overlaps horizontally with a portion of a metallic feature in the first metal layer to obstruct light incident on a first side of the IC device from transmission to a second side of the IC device through a region of the IC substrate near the via. The method further includes creating the via. The via electrically connects the first catch pad to the second catch pad.

In a seventh embodiment, a system is provided that includes an integrated circuit (IC) device having a first side and a second side. The system also includes a light sensor connected to the second side of the IC device and configured to sense light incident on the light sensor from the second side of the IC device. The system additionally includes a via extending through at least one layer of the IC device. The system further includes a first catch pad connected to the via and located within a first metal layer of the IC device. The first catch pad has a first size. The system yet further includes a second catch pad connected to the via and located within a second metal layer of the IC device. The second catch pad has a second size greater than the first size. The second catch pad overlaps horizontally with a portion of a metallic feature in the first metal layer to obstruct light incident on the first side of the IC device from transmission to the second side of the IC device through a region of transmissive IC device substrate material near the via and striking the light sensor.

In an eighth embodiment, a device is provided formed by a process that includes providing an integrated circuit (IC) substrate. The process also includes creating a first metal layer on the IC substrate. The first metal layer includes a first catch pad for a via. The first catch pad has a first size. The process additionally includes creating a second metal layer on the IC substrate. The second metal layer includes a second catch pad for the via. The second catch pad has a second size greater than the first size. The second catch pad overlaps horizontally with a portion of a metallic feature in the first metal layer to obstruct light incident on a first side of the IC from transmission to a second side of the IC through a region of the IC substrate near the via. The process further includes creating the via. The via electrically connects the first catch pad to the second catch pad.

These as well as other embodiments, aspects, advantages, and alternatives will become apparent to those of ordinary skill in the art by reading the following detailed description, with reference where appropriate to the accompanying drawings. Further, it should be understood that this summary and other descriptions and figures provided herein are intended to illustrate embodiments by way of example only and, as such, that numerous variations are possible. For instance, structural elements and process steps can be rearranged, combined, distributed, eliminated, or otherwise changed, while remaining within the scope of the embodiments as claimed.

DETAILED DESCRIPTION

Figure 1:
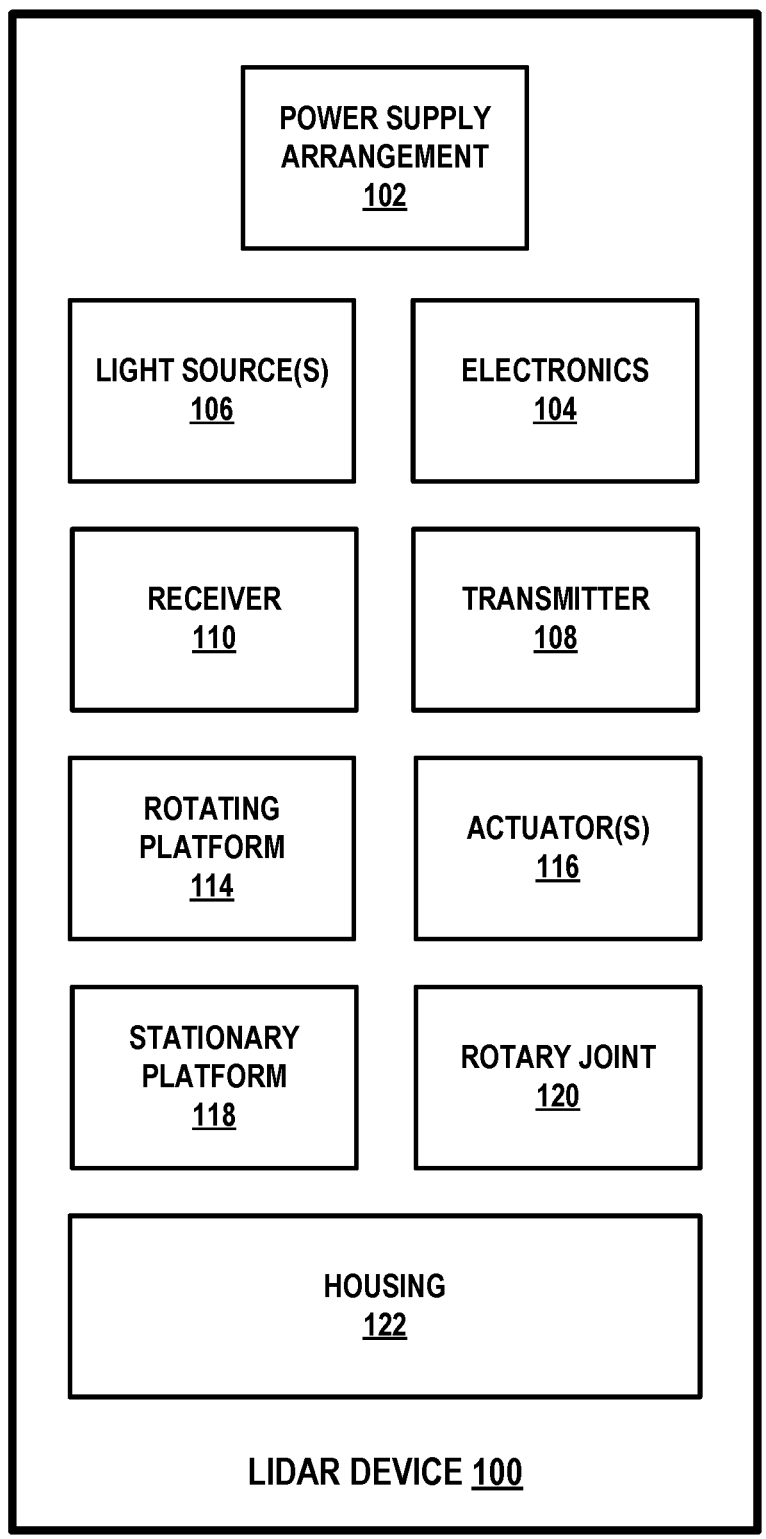
FIG. 1 illustrates a block diagram of an example LIDAR device, according to an example embodiment.

Example methods, devices, and systems are described herein. It should be understood that the words "example" and "exemplary" are used herein to mean "serving as an example, instance, or illustration." Any embodiment or feature described herein as being an "example" or "exemplary" is not necessarily to be construed as preferred or advantageous over other embodiments or features unless indicated as such. Other embodiments can be utilized, and other changes can be made, without departing from the scope of the subject matter presented herein.

Thus, the example embodiments described herein are not meant to be limiting. It will be readily understood that the aspects of the present disclosure, as generally described herein, and illustrated in the figures, can be arranged, substituted, combined, separated, and designed in a wide variety of different configurations.

Throughout this description, the articles "a" or "an" are used to introduce elements of the example embodiments. Any reference to "a" or "an" refers to "at least one," and any reference to "the" refers to "the at least one," unless otherwise specified, or unless the context clearly dictates otherwise. The intent of using the conjunction "or" within a described list of at least two terms is to indicate any of the listed terms or any combination of the listed terms.

The use of ordinal numbers such as "first," "second," "third" and so on is to distinguish respective elements rather than to denote a particular order of those elements. For purpose of this description, the terms "multiple" and "a plurality of" refer to "two or more" or "more than one."

Further, unless context suggests otherwise, the features illustrated in each of the figures may be used in combination with one another. Thus, the figures should be generally viewed as component aspects of one or more overall embodiments, with the understanding that not all illustrated features are necessary for each embodiment. In the figures, similar symbols typically identify similar components, unless context dictates otherwise. Further, unless otherwise noted, figures are not drawn to scale and are used for illustrative purposes only. Moreover, the figures are representational only and not all components are shown. For example, additional structural or restraining components might not be shown.

Additionally, any enumeration of elements, blocks, or steps in this specification or the claims is for purposes of clarity. Thus, such enumeration should not be interpreted to require or imply that these elements, blocks, or steps adhere to a particular arrangement or are carried out in a particular order.

I. OVERVIEW

Disclosed herein are example embodiments of non-uniform via (i.e., vertical interconnect access) catch pads, as well as methods and systems relating thereto. The non-uniform catch pads can block light from passing through a Printed Circuit Board (PCB) and causing unwanted triggering of sensitive light sensors. The catch pads may be implement in Light Detection And Ranging (LIDAR) PCBs, for example, or other applications that use sensitive light sensors. A LIDAR system may emit light using one or more transmitters (e.g., laser diodes) and receive back light using one or more corresponding receivers (e.g., sensors) to measure distance (and in some cases speed) of objects in the line of sight of the LIDAR. Receiver circuits may be based on very sensitive elements (like PhotoMultiplier Tubes (PMT), Avalanche PhotoDiodes (APD), and Silicon PhotoMultipliers (SiPM)) that, working in conjunction with an amplifier circuit, may allow the detection of a single photon. This high sensitivity to light may improve LIDAR resolution and range, but may lead to challenges in designing a system in which the overall LIDAR assembly and, in particular, the area around the sensitive light sensor is properly shielded against unintended or loose photons that could cause unwanted effects (e.g., unwanted triggering of the circuit, increased current consumption, etc.). In one embodiment, a non-uniform via pad-stack (in conjunction with filled vias) is adopted such that light can get reflected out of the PCB or absorbed internally by the metallization layers instead of passing through the PCB. Designing the via pad-stack in a manner that blocks loose photons from passing through the PCB may also allow inexpensive solder masks (e.g., green) to be used with light sensitive PCBs.

Via catch pads are conductive metal pads, often in the shape of annular rings, around the via. In some instances, a via catch pad may provide an electrical connection between the via and at least one metallic feature in a corresponding metal layer of the PCB. However, in other instances, the via catch pad might not be electrically connected to any metallic features in the corresponding metal layer (e.g., a catch pad of a stacked microvia). The non-uniformly sized via catch pads may extend into transmissive regions of the PCB around the via to provide an obstruction to the transmission of light through the otherwise transmissive regions around the via. In some instances, the non-uniformly sized catch pads may also overlap with or interpose between metallic features (e.g., traces, planes, pads) in adjacent metal layers of the PCB to further increase the likelihood of obstructing the transmission of light through the otherwise transmissive regions of the PCB around the via. The non-uniformly sized catch pads allow the two sides of the PCB to be optically isolated from each other. Thus, components mounted on a first side of the PCB can be isolated from light and other electromagnetic radiation incident on a second side of the PCB, and vice versa.

Conventionally, vias include catch pads of approximately (i.e., encompassing variations in manufacturing tolerances and manufacturing process variations) the same size. A minimum clearance space or gap, comprised of a transmissive dielectric PCB substrate material, may be provided between each catch pad and any nearby metallic features within the same metal layer. The clearance space may serve to physically separate and electrically isolate the catch pad from the nearby metallic features and reduce the likelihood of inadvertent physical electrical connections and flashovers. However, since the size of the via catch pads is uniform along the height of the via, this may result in a dielectric PCB substrate region, spanning the thickness of the PCB, through which light can be transmitted between the two sides of the PCB. Thus, light-sensitive components connected to the first side of the PCB may be inadvertently triggered by light or other electromagnetic radiation incident on the second side of the PCB and transmitted through the transmissive dielectric PCB substrate region around the via. In contrast, vias with nonuniform catch pads increase the probability of obstructing the transmission of light through the transmissive dielectric PCB substrate region around the via, thereby reducing an amount of light transmitted through the PCB, by including at least one catch pad that extends through the dielectric region.

Nonuniform via catch pads may be used with PCBs having two or more metal layers. In one example, a PCB may include a via extending through at least one layer of the PCB. That is, the PCB may include at least two metal layers separated by a dielectric substrate layer through which the via extends. The via may include at least two catch pads, each connected to the via and located within a corresponding one of the metal layers. A first catch pad, having a first size, may be connected to the via and may be located within a first metal layer of the PCB. A second catch pad may be connected to the via and may be located within a second metal layer of the PCB. In some examples, the first catch pad and the second catch pad may electrically connect the via to the first metal layer and the second metal layer, respectively. The second catch pad may have a second size greater than the first size and may thus extend through a region of the dielectric substrate material around the via. In some instances, the second catch pad may, due to the second larger size, overlap horizontally with a portion of a metallic feature in the first metal layer.

As a result of the second size being greater than the first size, the second catch pad may extend through a region of the PCB substrate that, if the first and second catch pads were of the same size, would be transmissive to light. Thus, the larger second catch pad obstructs light incident on a first side of the PCB from transmission to a second side of the PCB through the region of the dielectric PCB substrate near the via. Metallic features in the second metal layer may be routed to accommodate the increased size of the second catch pad and to maintain a desired clearance (i.e., spacing or separation) between the second catch pad and the metallic features. Similarly, in some embodiments, metallic features in the first metal layer may be routed to create, along the entire circumference of the second catch pad, continuous horizontal overlap between the metallic features in the first metal layer and the second catch pad.

The PCB may include additional metal layers through which the via extends as well as additional catch pads connected to the via and located within the additional metal layers. The relative size of the catch pads in the different metal layers may be selected to increase or maximize the complexity of the path (e.g., the path length, the number of reflections, etc.) that light would have to follow in order to move from the first side of the PCB to the second side of the PCB, thus reducing or minimizing the probability and extent of transmission.

In one example, a via may include catch pads of two sizes, which may be alternated along the metal layers to increase the extent of overlap and interposition of the catch pads with metallic features in adjacent metal layers (i.e., the metal layers above and below the metal layer containing a particular catch pad). In another example, via anti-pads (i.e., clearance regions around the via in a metal layer not including a via catch pad) may be positioned between the largest of the via catch pads to similarly increase the extent of overlap and interposition. In a further example, the arrangement of the catch pads may be selected to obstruct light incident at a particular angle on the top surface of the PCB.

The metallic features in other regions of the PCB may also be designed and routed to ensure that, at every point along the area of the PCB, there is, in at least one metal layer, at least one metallic feature that obstructs light from being directly transmitted between the two sides of the PCB. The metallic features may be further designed and routed to ensure that the at least one metallic feature overlaps horizontally with at least one other metallic feature in another metal layer. Thus, the PCB may be designed such that there is no point along the area of the PCB at which light may be transmitted through the PCB directly (i.e., without reflecting off of metallic features within the PCB). Notably, some light may nevertheless be transmitted by following an indirect zigzag path. However, the likelihood of such indirect transmission decreases with increasing extent of overlap between metallic features. Further, even if the light is not reflected back out the first side, it is likely that the light will be internally absorbed by the metal layers before reaching the second side. Thus, the techniques herein described effectively reduce the likelihood and amount of light transmission through the PCB. That is, the likelihood of a single photon being transmitted through the PCB may be reduced, therefore reducing the proportion of the light incident on the PCB that gets transmitted through the PCB.

In some embodiments, a light sensor may be connected to the second side of the PCB. The light sensor may be configured to sense light incident on the light sensor from the second side of the PCB. That is, light incident on the first side of the PCB, transmitted through the PCB, and incident on the light sensor may constitute undesirable noise. Accordingly, by overlapping horizontally with the portion of the metallic feature in the first metal layer, the second catch pad may operate to reduce the level of electromagnetic noise that reaches the light sensor.

In some instances, the light sensor may form part of a Light Detection and Ranging (LIDAR) device that may be used as a sensor for mapping out an environment. The map of the environment may be used, for example, by a robotic device or a vehicle to perform operations within the environment. An enclosure may be disposed about the light sensor. The enclosure may include an aperture configured to direct light from an environment onto the light sensor. The light directed onto the light sensor may include light emitted by a light source of the LIDAR device that has been reflected off of a physical feature in the environment, thus allowing for the mapping of the environment based on, for example, time of flight of the light emitted by the light source.

A gasket surrounding the light sensor may be disposed between the second side of the PCB and the enclosure to further shield the light sensor from other optical noise. Specifically, the gasket may be configured to block light incident on an interface between the PCB and the enclosure. Accordingly, the PCB with nonuniform via catch pads, the enclosure, and the gasket may collectively operate to reduce the amount of optical noise reaching the light sensor, thus increasing the signal to noise ratio.

The PCB with nonuniform via catch pads may be used in other applications that require electromagnetic shielding. For example, the PCB may be used to provide more effective electromagnetic shielding from radiation incident on the first side of the PCB of other electromagnetic sensors or other components sensitive to electromagnetic radiation that are connected to a second side of the PCB. The PCB with nonuniform catch pads may be used to provide shielding from, for example, electromagnetic radiation having a wavelength that is smaller than a size of the gap (i.e., slit size) in the dielectric PCB substrate region and therefore propagates through the gap via line-of-sight propagation (e.g., ultraviolet, visible, infrared).

The PCB with nonuniform catch pads may be manufactured using standard PCB manufacturing processes, including photolithography, metal etching, metal plating, laminating, solder resist application, legend printing, Computer Numerical Control (CNC) Milling, and laser drilling, among other possibilities. These processes may be performed manually, automatically, or by a combination of manual and automated steps. Similarly, the process of designing the PCB with nonuniform via catch pads may be performed by a combination of manual and automated steps. For example, PCB design software may be programmed to include a Design Rule Check (DRC) that verifies whether the PCB includes any points along the area thereof that are directly transmissible to light. The PCB design software may be further programmed to identify and indicate locations where the design rule is not met and, in some embodiments, propose potential redesign of the metallic features to meet the design rule.

Nonuniform via catch pads may also be implemented on an integrated circuit (IC) device, rather than a PCB, to obstruct the transmission of light through transmissive regions of the integrated circuit device surrounding the via. Nonuniform catch pads, as well as any of the other techniques herein described, may be used in combination with or instead of IC packaging to obstruct the transmission of light through the IC. Non-transmissive IC packaging may obstruct the transmission of light through packaged portions of the IC. However, some parts of the IC may be left unpackaged or may be packaged by transmissive materials to, for example, expose a portion of the IC to the environment (e.g., expose a sensor on the IC to the environment). The nonuniform catch pads may be used to obstruct the transmission of light through the unpackaged or otherwise exposed portions of the IC.

The obstruction may reduce the likelihood of light incident on a first side of the IC from being transmitted to a second side of the IC and potentially striking a light-sensitive portion of the IC on the second side thereof. Further, the obstruction may reduce the likelihood of electromagnetic radiation incident on either side of the IC from reaching electronic components within the IC and potentially causing latch-up. Other benefits due to the reduced transmission of light through the IC may be possible.

II. EXAMPLE LIDAR DEVICES

Referring now to the Figures, FIG. 1 is a simplified block diagram of a LIDAR device 100, according to an example embodiment. As shown, the LIDAR device 100 includes a power supply arrangement 102, electronics 104, light source(s) 106, a transmitter 108, a receiver 110, a rotating platform 114, actuator(s) 116, a stationary platform 118, a rotary link 120, and a housing 122. In other embodiments, the LIDAR device 100 may include more, fewer, or different components. Additionally, the components shown may be combined or divided in any number of ways.

Power supply arrangement 102 may be configured to supply power to various components of the LIDAR device 100. In particular, the power supply arrangement 102 may include or otherwise take the form of at least one power source disposed within the LIDAR device 100 and connected to various components of the LIDAR device 100 in any feasible manner, so as to supply power to those components. Additionally or alternatively, the power supply arrangement 102 may include or otherwise take the form of a power adapter or the like that is configured to receive power from one or more external power sources (e.g., from a power source arranged in a vehicle to which the LIDAR device 100 is coupled) and to supply that received power to various components of the LIDAR device 100 in any feasible manner. In either case, any type of power source may be used such as, for example, a battery.

Electronics 104 may include one or more electronic components and/or systems each arranged to help facilitate certain respective operations of the LIDAR device 100. In practice, these electronics 104 may be disposed within the LIDAR device 100 in any feasible manner. For instance, at least some of the electronics 104 may be disposed within a central cavity region of the rotary link 120. Nonetheless, the electronics 104 may include various types of electronic components and/or systems.

For example, the electronics 104 may include various wirings used for transfer of control signals from a controller to various components of the LIDAR device 100 and/or for transfer of data from various components of the LIDAR device 100 to the controller. Generally, the data that the controller receives may include sensor data based on detections of light by the receiver 110, among other possibilities. Moreover, the control signals sent by the controller may operate various components of the LIDAR device 100, such as by controlling emission of light by the transmitter 108, controlling detection of light by the receiver 110, and/or controlling the actuator(s) 116 to rotate the rotating platform 114, among other possibilities.

In some arrangements, the electronics 104 may also include the controller at issue. This controller may have one or more processors, data storage, and program instructions stored on the data storage and executable by the one or more processor to facilitate various operations. Additionally or alternatively, the controller may communicate with an external controller or the like (e.g., a computing system arranged in a vehicle to which the LIDAR device 100 is coupled) so as to help facilitate transfer of control signals and/or data between the external controller and the various components of the LIDAR device 100.

In other arrangements, however, the electronics 104 may not include the controller at issue. Rather, at least some of the above-mentioned wirings may be used for connectivity to an external controller. With this arrangement, the wirings may help facilitate transfer of control signals and/or data between the external controller and the various components of the LIDAR device 100. Other arrangements are possible as well.

Further, one or more light sources 106 can be configured to emit, respectively, a plurality of light beams and/or pulses having wavelengths within a wavelength range. The wavelength range could, for example, be in the ultraviolet, visible, and/or infrared portions of the electromagnetic spectrum. In some examples, the wavelength range can be a narrow wavelength range, such as provided by lasers.

In some arrangements, the one or more light sources 106 may include laser diodes, light emitting diodes (LED), vertical cavity surface emitting lasers (VCSEL), organic light emitting diodes (OLED), polymer light emitting diodes (PLED), light emitting polymers (LEP), liquid crystal displays (LCD), microelectromechanical systems (MEMS), and/or any other device configured to selectively transmit, reflect, and/or emit light to provide the plurality of emitted light beams and/or pulses.

In some embodiments, transmitter 108 may be configured to emit light into an environment. In particular, the transmitter 108 may include an optical arrangement that is arranged to direct light from a light source 106 toward the environment. This optical arrangement may include any feasible combination of mirror(s) used to guide propagation of the light throughout physical space and/or lens(es) used to adjust certain characteristics of the light, among other optical components. For instance, the optical arrangement may include a transmit lens arranged to collimate the light, thereby resulting in light having rays that are substantially parallel to one another.

As noted, the LIDAR device 100 may include a receiver 110. The receiver may be configured to detect light having wavelengths in the same wavelength range as the one of the light emitted from the transmitter 108. In this way, the LIDAR device 100 may distinguish reflected light pulses originated at the LIDAR device 100 from other light in the environment.

Additionally, the receiver 110 may be configured to scan the environment with a field of view (FOV). For instance, the FOV of the receiver 110 may allow for detection of light substantially along the same angular range as the light emitted by transmitter 108. In an example implementation, the receiver 110 may have an optical arrangement that allows the receiver to provide the FOV a particular resolution. Generally, such optical arrangement may be arranged to provide an optical path between at least one optical lens and a photodetector array.

In one implementation, the receiver 110 may include an optical lens arranged to focus light reflected from one or more objects in the environment of the LIDAR device 100 onto detectors of the receiver 110.

Furthermore, as noted, the receiver 110 may have a photodetector array, which may include one or more detectors configured to convert detected light (e.g., in the above-mentioned wavelength range) into an electrical signal indicative of the detected light. In practice, such a photodetector array could be arranged in one of various ways. For example, the detectors can be disposed on one or more substrates (e.g., printed circuit boards (PCBs), flexible PCBs, etc.) and arranged to detect incoming light that is traveling along the optical path from the optical lens. In general, a component disposed on a substrate may be disposed above or beneath the substrate. Also, such a photodetector array could include any feasible number of detectors aligned in any feasible manner. For example, the photodetector array may include a 13×16 array of detectors. It is noted that this photodetector array is described for exemplary purposes only and is not meant to be limiting.

Generally, the detectors of the array may take various forms. For example, the detectors may take the form of photodiodes, avalanche photodiodes, phototransistors, cameras, active pixel sensors (APS), charge coupled devices (CCD), cryogenic detectors, and/or any other sensor of light configured to receive focused light having wavelengths in the wavelength range of the emitted light. Other examples are possible as well.

Further, as noted, the LIDAR device 100 may include a rotating platform 114 that is configured to rotate about an axis. In order to rotate in this manner, one or more actuators 116 may actuate the rotating platform 114. In practice, these actuators 116 may include motors, pneumatic actuators, hydraulic pistons, and/or piezoelectric actuators, among other possibilities.

In accordance with the present disclosure, the transmitter 108 and the receiver 110 may be arranged on the rotating platform such that each of these components moves relative to the environment based on rotation of the rotating platform 114. In particular, each of these components could be rotated relative to an axis so that the LIDAR device 100 may obtain information from various directions. In this manner, the LIDAR device 100 may have a horizontal viewing direction that can be adjusted by actuating the rotating platform 114 to different directions.

With this arrangement, a controller could direct an actuator 116 to rotate the rotating platform 114 in various ways so as to obtain information about the environment in various ways. In particular, the rotating platform 114 could rotate at various extents and in either direction. For example, the rotating platform 114 may carry out full revolutions such that the LIDAR device 100 provides a 360° horizontal FOV of the environment.

Moreover, the rotating platform 114 could rotate at various rates so as to cause LIDAR device 100 to scan the environment at various refresh rates. For example, the LIDAR device 100 may be configured to have a refresh rate of 15 Hz (e.g., fifteen complete rotations of the LIDAR device 100 per second). In this example, assuming that the LIDAR device 100 is coupled to a vehicle as further described below, the scanning thus involves scanning a 360° FOV around the vehicle fifteen times every second. Other examples are also possible.

Yet further, as noted, the LIDAR device 100 may include a stationary platform 118. In practice, the stationary platform may take on any shape or form and may be configured for coupling to various structures, such as to a top of a vehicle for example. Also, the coupling of the stationary platform may be carried out via any feasible connector arrangement (e.g., bolts and/or screws). In this way, the LIDAR device 100 could be coupled to a structure so as to be used for various purposes, such as those described herein.

In accordance with the present disclosure, the LIDAR device 100 may also include a rotary joint 120 that directly or indirectly couples the stationary platform 118 to the rotating platform 114. Specifically, the rotary joint 120 may take on any shape, form and material that provides for rotation of the rotating platform 114 about an axis relative to the stationary platform 118. For instance, the rotary joint 120 may take the form of a shaft or the like that rotates based on actuation from an actuator 116, thereby transferring mechanical forces from the actuator 116 to the rotating platform 114. Moreover, as noted, the rotary joint may have a central cavity in which electronics 104 and/or one or more other components of the LIDAR device 100 may be disposed. Other arrangements are possible as well.

Yet further, as noted, the LIDAR device 100 may include a housing 122. In practice, the housing 122 may take on any shape, form, and material. For example, the housing 122 can be a dome-shaped housing, among other possibilities. In another example, the housing 122 may be composed of a material that is at least partially non-transparent, which may allow for blocking of at least some light from entering the interior space of the housing 122 and thus help mitigate thermal effects as further discussed below. It is noted that this housing is described for exemplary purposes only and is not meant to be limiting.

In accordance with the present disclosure, the housing 122 may be coupled to the rotating platform 114 such that the housing 122 is configured to rotate about the above-mentioned axis based on rotation of the rotating platform 114. With this implementation, the transmitter 108, the receiver 110, and possibly other components of the LIDAR device 100 may each be disposed within the housing 122. In this manner, the transmitter 108 and the receiver 110 may rotate along with this housing 122 while being disposed within the housing 122.

Moreover, the housing 122 may have an aperture formed thereon, which could take on any feasible shape and size. In this regard, the transmitter 108 could be arranged within the housing 122 so as to emit light into the environment through the aperture. In this way, the transmitter 108 may rotate along with the aperture due to corresponding rotation of the housing 122, thereby allowing for emission of light into various directions. Also, the receiver 110 could be arranged within the housing 122 so as detect light that enters the housing 122 from the environment through the aperture. In this way, the receiver 110 may rotate along with the aperture due to corresponding rotating of the housing 122, thereby allowing for detection of the light incoming from various directions along the horizontal FOV.

In practice, the housing 122 may be arranged as described above for various reasons. Specifically, due to various components of the LIDAR device 100 being disposed within the housing 122 and due to the housing 122 rotating along with those components, the housing 122 may help protect those components from various environmental hazards, such as rain and/or snow, among others. Also, if the housing 122 were to be stationary as the LIDAR device 100 rotates within the housing 122, then the housing 122 would likely be transparent so as to allow for propagation of light through the housing 122 and thus for scanning of the environment by the LIDAR device 100.

In accordance with the present disclosure, however, the housing 122 may have the aperture that rotates along with the LIDAR device 100, which means that the housing 122 does not necessarily need to be fully transparent to allow for scanning of the environment. For example, the housing 122 could be composed of at least a partially non-transparent material, except for the aperture, which could be composed of a transparent material. As a result, the housing 122 may help mitigate thermal effects on the LIDAR device 100. For instance, the housing 122 may block sun rays from entering the interior space of the housing 122, which may help avoid overheating of various components of the LIDAR device 100 due to those sun rays. Other instances are possible as well.

Given the various components of the LIDAR device 100 as described above, these various components could be arranged in various ways. In accordance with the present disclosure, assuming that the LIDAR device 100 is spatially oriented such that the stationary platform 118 is closest to a ground surface, the LIDAR device 100 may be arranged such that the receiver 110 is positioned substantially above the stationary platform 118 and the transmitter 108 is positioned substantially above the receiver 110. However, it is noted that this arrangement is described for exemplary purposes only and is not meant to be limiting.

III. EXAMPLE VEHICLE SYSTEM

Figure 2:
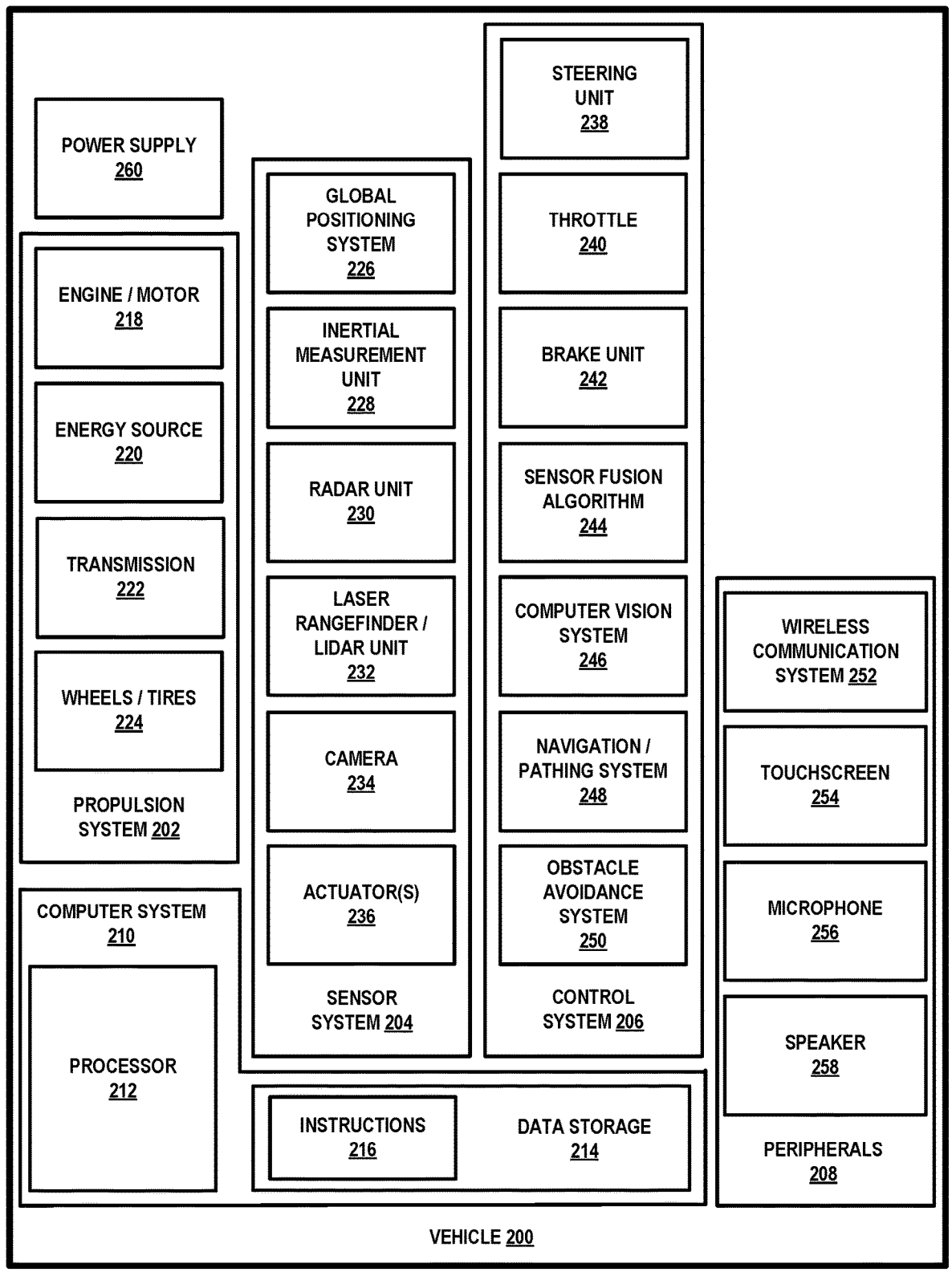
FIG. 2 illustrates a simplified block diagram of a vehicle, according to an example embodiment.

FIG. 2 is a simplified block diagram of a vehicle 200, according to an example embodiment. The vehicle 200 may include a LIDAR device similar to the LIDAR device 100. As shown, the vehicle 200 includes a propulsion system 202, a sensor system 204, a control system 206 (could also be referred to as a controller 206), peripherals 208, and a computer system 210. In other embodiments, the vehicle 200 may include more, fewer, or different systems, and each system may include more, fewer, or different components.

Additionally, the systems and components shown may be combined or divided in any number of ways. For instance, the control system 206 and the computer system 210 may be combined into a single system that operates the vehicle 200 in accordance with various operations.

The propulsion system 202 may be configured to provide powered motion for the vehicle 200. As shown, the propulsion system 202 includes an engine/motor 218, an energy source 220, a transmission 222, and wheels/tires 224.

The engine/motor 218 may be or include any combination of an internal combustion engine, an electric motor, a steam engine, and a Sterling engine. Other motors and engines are possible as well. In some embodiments, the propulsion system 202 may include multiple types of engines and/or motors. For instance, a gas-electric hybrid car may include a gasoline engine and an electric motor. Other examples are possible.

The energy source 220 may be a source of energy that powers the engine/motor 218 in full or in part. That is, the engine/motor 218 may be configured to convert the energy source 220 into mechanical energy. Examples of energy sources 220 include gasoline, diesel, propane, other compressed gas-based fuels, ethanol, solar panels, batteries, and other sources of electrical power. The energy source(s) 220 may additionally or alternatively include any combination of fuel tanks, batteries, capacitors, and/or flywheels. In some embodiments, the energy source 220 may provide energy for other systems of the vehicle 200 as well.

The transmission 222 may be configured to transmit mechanical power from the engine/motor 218 to the wheels/tires 224. To this end, the transmission 222 may include a gearbox, clutch, differential, drive shafts, and/or other elements. In embodiments where the transmission 222 includes drive shafts, the drive shafts may include one or more axles that are configured to be coupled to the wheels/tires 224.

The wheels/tires 224 of vehicle 200 may be configured in various formats, including a unicycle, bicycle/motorcycle, tricycle, or car/truck four-wheel format. Other wheel/tire formats are possible as well, such as those including six or more wheels. In any case, the wheels/tires 224 may be configured to rotate differentially with respect to other wheels/tires 224. In some embodiments, the wheels/tires 224 may include at least one wheel that is fixedly attached to the transmission 222 and at least one tire coupled to a rim of the wheel that could make contact with the driving surface. The wheels/tires 224 may include any combination of metal and rubber, or combination of other materials. The propulsion system 202 may additionally or alternatively include components other than those shown.

The sensor system 204 may include a number of sensors configured to sense information about an environment in which the vehicle 200 is located, as well as one or more actuators 236 configured to modify a position and/or orientation of the sensors. As shown, the sensors of the sensor system 204 include a Global Positioning System (GPS) 226, an inertial measurement unit (IMU)228, a RADAR unit 230, a laser rangefinder and/or LIDAR unit 232, and a camera 234. The sensor system 204 may include additional sensors as well, including, for example, sensors that monitor internal systems of the vehicle 200 (e.g., an O$_2$ monitor, a fuel gauge, an engine oil temperature, etc.). Other sensors are possible as well.

The GPS 226 may be any sensor (e.g., location sensor) configured to estimate a geographic location of the vehicle 200. To this end, the GPS 226 may include a transceiver configured to estimate a position of the vehicle 200 with respect to the Earth. The GPS 226 may take other forms as well.

The IMU 228 may be any combination of sensors configured to sense position and orientation changes of the vehicle 200 based on inertial acceleration. In some embodiments, the combination of sensors may include, for example, accelerometers and gyroscopes. Other combinations of sensors are possible as well.

The RADAR unit 230 may be any sensor configured to sense objects in the environment in which the vehicle 200 is located using radio signals. In some embodiments, in addition to sensing the objects, the RADAR unit 230 may additionally be configured to sense the speed and/or heading of the objects.

Similarly, the laser range finder or LIDAR unit 232 may be any sensor configured to sense objects in the environment in which the vehicle 200 is located using lasers. For example, LIDAR unit 232 may include one or more LIDAR devices, at least some of which may take the form the LIDAR device 100 disclosed herein.

The camera 234 may be any camera (e.g., a still camera, a video camera, etc.) configured to capture images of the environment in which the vehicle 200 is located. To this end, the camera may take any of the forms described above. The sensor system 204 may additionally or alternatively include components other than those shown.

The control system 206 may be configured to control operation of the vehicle 200 and its components. To this end, the control system 206 may include a steering unit 238, a throttle 240, a brake unit 242, a sensor fusion algorithm 244, a computer vision system 246, a navigation or pathing system 248, and an obstacle avoidance system 250.

The steering unit 238 may be any combination of mechanisms configured to adjust the heading of vehicle 200. The throttle 240 may be any combination of mechanisms configured to control the operating speed of the engine/motor 218 and, in turn, the speed of the vehicle 200. The brake unit 242 may be any combination of mechanisms configured to decelerate the vehicle 200. For example, the brake unit 242 may use friction to slow the wheels/tires 224. As another example, the brake unit 242 may convert the kinetic energy of the wheels/tires 224 to electric current. The brake unit 242 may take other forms as well.

The sensor fusion algorithm 244 may be an algorithm (or a computer program product storing an algorithm) configured to accept data from the sensor system 204 as an input. The data may include, for example, data representing information sensed at the sensors of the sensor system 204. The sensor fusion algorithm 244 may include, for example, a Kalman filter, a Bayesian network, an algorithm for some of the functions of the methods herein, or any other algorithm. The sensor fusion algorithm 244 may further be configured to provide various assessments based on the data from the sensor system 204, including, for example, evaluations of individual objects and/or features in the environment in which the vehicle 200 is located, evaluations of particular situations, and/or evaluations of possible impacts based on particular situations. Other assessments are possible as well.

The computer vision system 246 may be any system configured to process and analyze images captured by the camera 234 in order to identify objects and/or features in the environment in which the vehicle 200 is located, including, for example, traffic signals and obstacles. To this end, the computer vision system 246 may use an object recognition algorithm, a Structure from Motion (SFM) algorithm, video tracking, or other computer vision techniques. In some embodiments, the computer vision system 246 may additionally be configured to map the environment, track objects, estimate the speed of objects, etc.

The navigation and pathing system 248 may be any system configured to determine a driving path for the vehicle 200. The navigation and pathing system 248 may additionally be configured to update the driving path dynamically while the vehicle 200 is in operation. In some embodiments, the navigation and pathing system 248 may be configured to incorporate data from the sensor fusion algorithm 244, the GPS 226, the LIDAR unit 232, and one or more predetermined maps so as to determine the driving path for vehicle 200.

The obstacle avoidance system 250 may be any system configured to identify, evaluate, and avoid or otherwise negotiate obstacles in the environment in which the vehicle 200 is located. The control system 206 may additionally or alternatively include components other than those shown.

Peripherals 208 may be configured to allow the vehicle 200 to interact with external sensors, other vehicles, external computing devices, and/or a user. To this end, the peripherals 208 may include, for example, a wireless communication system 252, a touchscreen 254, a microphone 256, and/or a speaker 258.

The wireless communication system 252 may be any system configured to wirelessly couple to one or more other vehicles, sensors, or other entities, either directly or via a communication network. To this end, the wireless communication system 252 may include an antenna and a chipset for communicating with the other vehicles, sensors, servers, or other entities either directly or via a communication network. The chipset or wireless communication system 252 in general may be arranged to communicate according to one or more types of wireless communication (e.g., protocols) such as Bluetooth, communication protocols described in IEEE 802.11 (including any IEEE 802.11 revisions), cellular technology (such as GSM, CDMA, UMTS, EV-DO, WiMAX, or LTE), Zigbee, dedicated short range communications (DSRC), and radio frequency identification (RFID) communications, among other possibilities. The wireless communication system 252 may take other forms as well.

The touchscreen 254 may be used by a user to input commands to the vehicle 200. To this end, the touchscreen 254 may be configured to sense at least one of a position and a movement of a user's finger via capacitive sensing, resistance sensing, or a surface acoustic wave process, among other possibilities. The touchscreen 254 may be capable of sensing finger movement in a direction parallel or planar to the touchscreen surface, in a direction normal to the touchscreen surface, or both, and may also be capable of sensing a level of pressure applied to the touchscreen surface. The touchscreen 254 may be formed of one or more translucent or transparent insulating layers and one or more translucent or transparent conducting layers. The touchscreen 254 may take other forms as well.

The microphone 256 may be configured to receive audio (e.g., a voice command or other audio input) from a user of the vehicle 200. Similarly, the speakers 258 may be configured to output audio to the user of the vehicle 200. The peripherals 208 may additionally or alternatively include components other than those shown.

The computer system 210 may be configured to transmit data to, receive data from, interact with, and/or control one or more of the propulsion system 202, the sensor system 204, the control system 206, and the peripherals 208. To this end, the computer system 210 may be communicatively linked to one or more of the propulsion system 202, the sensor system 204, the control system 206, and the peripherals 208 by a system bus, network, and/or other connection mechanism (not shown).

In one example, the computer system 210 may be configured to control operation of the transmission 222 to improve fuel efficiency. As another example, the computer system 210 may be configured to cause the camera 234 to capture images of the environment. As yet another example, the computer system 210 may be configured to store and execute instructions corresponding to the sensor fusion algorithm 244. As still another example, the computer system 210 may be configured to store and execute instructions for determining a 3D representation of the environment around the vehicle 200 using the LIDAR unit 232. Other examples are possible as well. Thus, the computer system 210 could function as the controller for the LIDAR unit 232.

As shown, the computer system 210 includes the processor 212 and data storage 214. The processor 212 may comprise one or more general-purpose processors and/or one or more special-purpose processors. To the extent the processor 212 includes more than one processor, such processors could work separately or in combination. Data storage 214, in turn, may comprise one or more volatile and/or one or more non-volatile storage components, such as optical, magnetic, and/or organic storage, and data storage 214 may be integrated in whole or in part with the processor 212.

In some embodiments, data storage 214 may contain instructions 216 (e.g., program logic) executable by the processor 212 to execute various vehicle functions. Data storage 214 may contain additional instructions as well, including instructions to transmit data to, receive data from, interact with, and/or control one or more of the propulsion system 202, the sensor system 204, the control system 206, and/or the peripherals 208. The computer system 210 may additionally or alternatively include components other than those shown.

As shown, the vehicle 200 further includes a power supply 260, which may be configured to provide power to some or all of the components of the vehicle 200. To this end, the power supply 260 may include, for example, a rechargeable lithium-ion or lead-acid battery. In some embodiments, one or more banks of batteries could be configured to provide electrical power. Other power supply materials and configurations are possible as well. In some embodiments, the power supply 260 and energy source 220 may be implemented together as one component, as in some all-electric cars.

In some embodiments, the vehicle 200 may include one or more elements in addition to or instead of those shown. For example, the vehicle 200 may include one or more additional interfaces and/or power supplies. Other additional components are possible as well. In such embodiments, data storage 214 may further include instructions executable by the processor 212 to control and/or communicate with the additional components.

Still further, while each of the components and systems are shown to be integrated in the vehicle 200, in some embodiments, one or more components or systems may be removably mounted on or otherwise connected (mechanically or electrically) to the vehicle 200 using wired or wireless connections. The vehicle 200 may take other forms as well.

Figure 3:
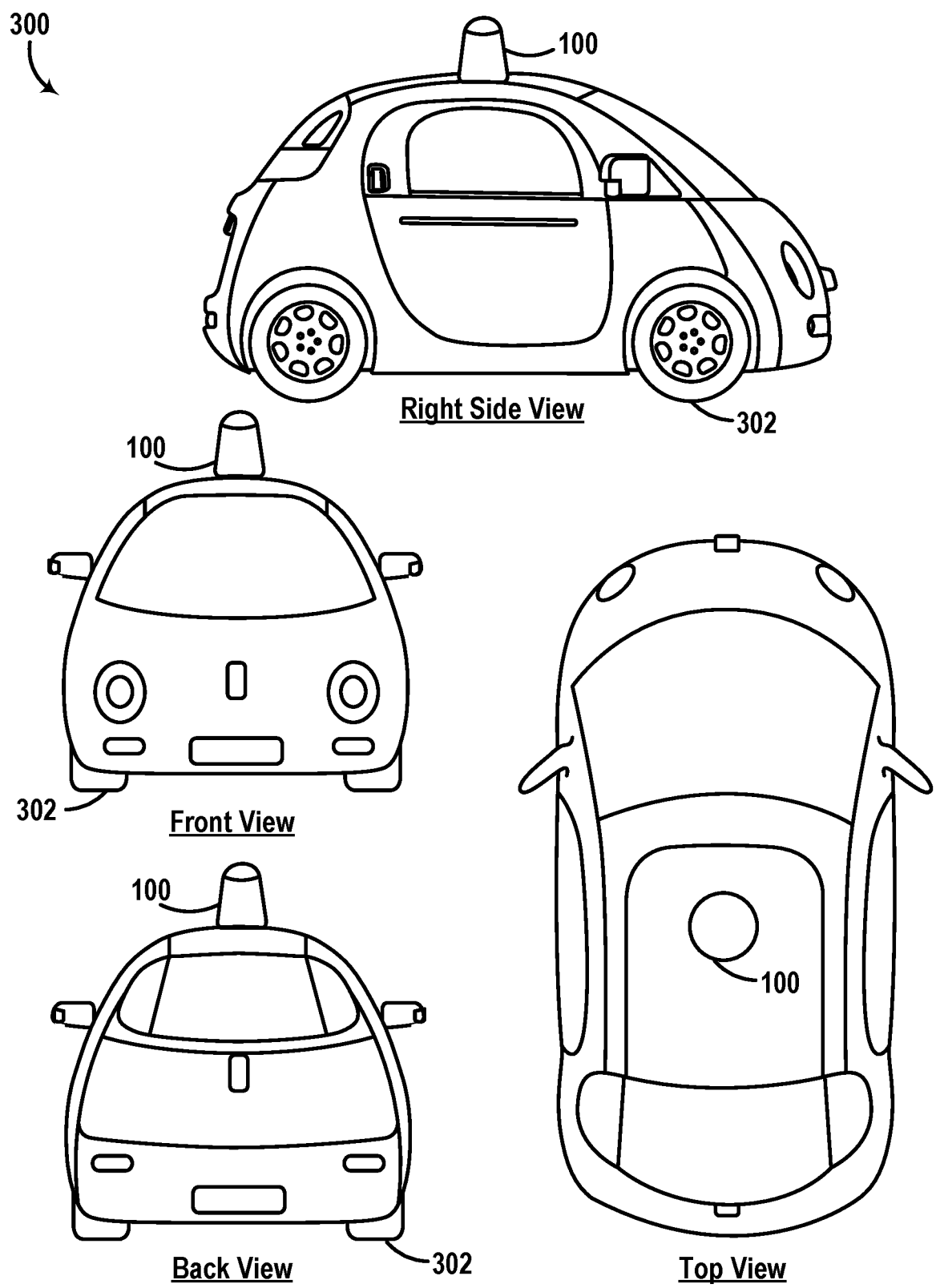
FIG. 3 illustrates several views of a LIDAR device positioned on top of a vehicle, according to an example embodiment.

FIG. 3 shows a Right Side View, Front View, Back View, and Top View of the vehicle 300. As shown, the vehicle 300 includes the LIDAR device 100 being positioned on a top side of the vehicle 300 opposite a bottom side on which wheels 302 of the vehicle 300 are located. Although the LIDAR device 100 is shown and described as being positioned on the top side of the vehicle 300, the LIDAR device 100 could be positioned on any feasible portion or part of the vehicle without departing from the scope of the present disclosure.

Moreover, the LIDAR device 100 may be configured to scan an environment around the vehicle 300 (e.g., at a refresh rate of 15 Hz) by rotating about the vertical axis while emitting one or more light pulses and detecting reflected light pulses off objects in the environment of the vehicle 300, for example. Further, in some implementations, multiple LIDAR devices could be positioned on different portions of the vehicle (e.g., one LIDAR device on each corner of the vehicle) so that each LIDAR device is able to scan a different portion of the environment.

IV. EXAMPLE PCB WITH OPTICAL ISOLATION

Figure 4:
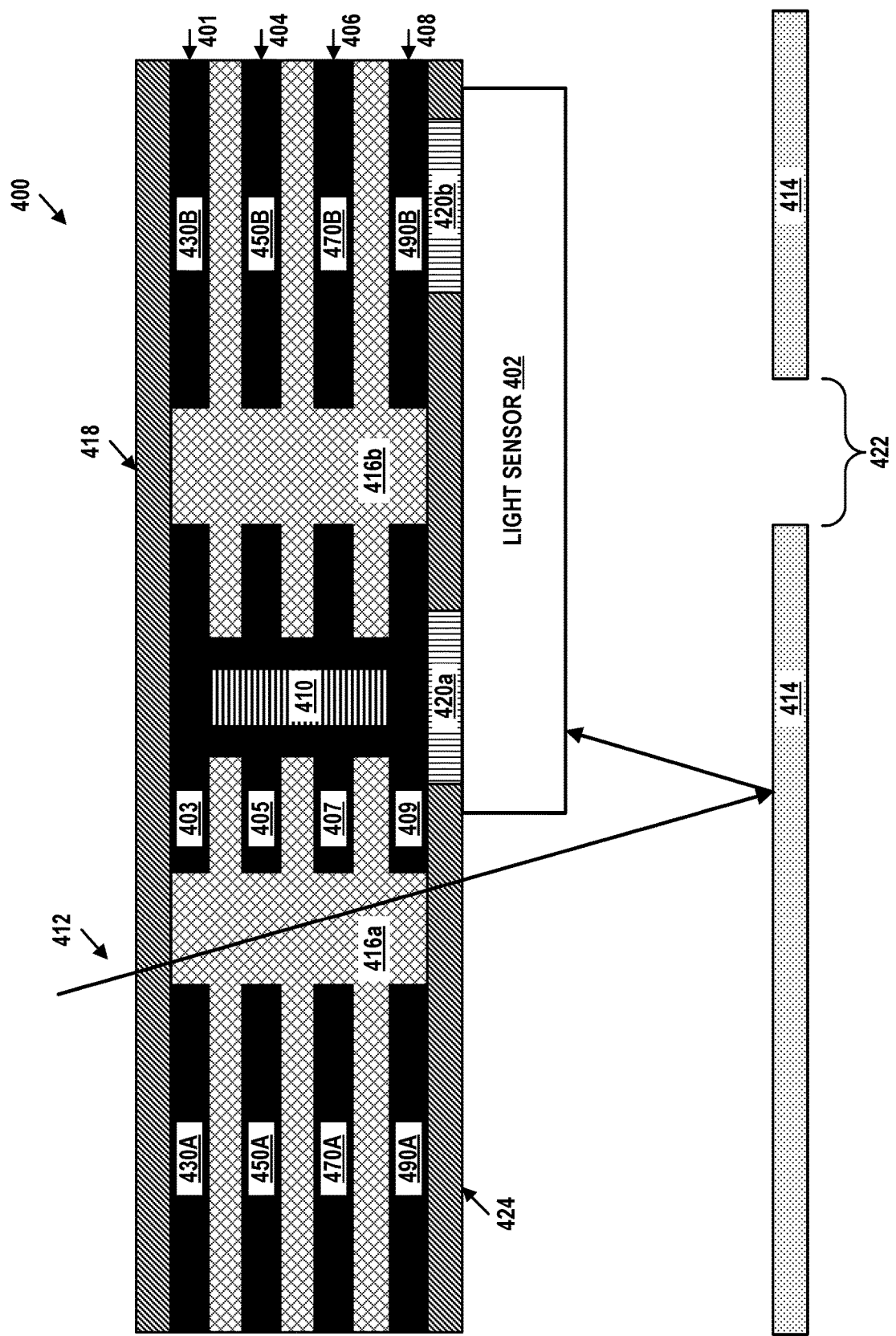
FIG. 4 illustrates a lateral cross-sectional view of a Printed Circuit Board with uniform via pads, according to an example embodiment.

FIG. 4 illustrates a lateral cross-section of an example Printed Circuit Board (PCB) 400. PCB 400 includes metal layers 401, 404, 406, and 408, top solder mask 418, and bottom solder mask 424. PCB 400 also includes via 410 (i.e., a vertical interconnect access) with corresponding catch pads 403, 405, 407, and 409. Light sensor 402 may be connected to PCB 400 by way of solder pads 420a and 420b. PCB 400 may be mounted in or near enclosure 414 which defines an aperture 422 for light to be sensed by light sensor 402. PCB 400 may include regions 416a and 416b of transmissive PCB substrate material that may permit light 412 incident on the top of PCB 400 to be directly transmitted to the bottom of PCB 400, reflect off of enclosure 414 or another reflective surface, and strike light sensor 402.

Metal layers 401, 404, 406, and 408 of PCB 400 may be separated from one another by regions of the PCB substrate material (e.g., FR-4 glass-reinforced epoxy laminate), as indicated by the cross-hatched pattern. The metal layers may include various metallic features 430A, 430B, 450A, 450B, 470A, 470B, 490A, and 490B (i.e., metallic features 430A 490B) such as, for example, traces (e.g., signal traces), contact pads (e.g., solder pads, via catch pads), and planes (e.g., ground planes, power planes). The various metallic features 430A 490B may make up the electrical connections that result in PCB 400 operating according to a desired design (e.g., powering light sensor 402 and providing an electrical communication path between light sensor 402 and a processor). Notably, metallic features in a particular layer may be electrically connected or disconnected from one another and from other metallic features in other layers, as needed to establish the desired interconnections between components on the PCB.

PCB 400 also includes via 410 electrically connecting at least two of the metal layers 401, 404, 406, and 408. Specifically, via 410 is electrically connected to catch pads 403, 405, 407, and 409. Catch pad 403 may, in some instances, electrically connect via 410 to at least one metallic feature in metal layer 401. Similarly, catch pad 405 may electrically connect via 410 to at least one metallic feature in metal layer 404, catch pad 407 may electrically connect via 410 to at least one metallic feature in metal layer 406, and catch pad 409 may electrically connect via 410 to at least one metallic feature in metal layer 408.

Although via 410 is shown as a through-hole via, via 410 may, in other embodiments, be a blind via, extending through only a portion of the layers of PCB 400 with one end of the via exposed to either the top surface or the bottom surface of PCB 400, or a buried via, extending through only a portion of the layers of PCB 400 with neither end of the via exposed to the top surface or the bottom surface of PCB 400. Via 410 may, in some embodiments, be a microvia (e.g., a stacked microvia) used in a high density interconnect (HDI) PCB. Further, in some examples, via 410 may for part of a staggered via structure or a staggered microvia structure. In some implementations, via 410 may be filled with a conductive or nonconductive material.

In general, catch pads 403, 405, 407, and 409 may be regions of metal electrically connected to via 410 and may, in some embodiments, electrically connect via 410 to metallic features 430A-490B in respective metal layers 401, 404, 406, and 408. In some embodiments, the catch pads may be annular rings surrounding via 410. Specifically, an annular ring may have an inner circumference and an outer circumference, as well as corresponding inner and outer diameters. The inner circumference of the annular ring may be in contact with via 410, and the area between the inner and outer circumference of the annular ring may be filled with metal or another conductive and non-transmissive material. In other embodiments, the catch pad may take on different shapes such as, for example, a square or a rectangle. That is, the outer boundary of the catch pad may be square or rectangular while a circular hole defines the inner circumference in contact with via 410. The catch pad may be continuous, completely surrounding via 410, or discontinuous, partially surrounding via 410.

FIG. 4 further illustrates light sensor 402 connected to the bottom of PCB 400. In particular, light sensor 402 may be soldered or otherwise bonded to pads 420a and 420b, as well as other pads (not shown), to provide an electrical connection to PCB 400. PCB 400 and light sensor 402 may be positioned near enclosure 414 defining an aperture 422 through which light may be directed onto the light sensor. In one example, light sensor 402 may be part of a LIDAR device (e.g., LIDAR device 100). Light emitted by a light source of the LIDAR device may, after reflecting from a feature within an environment, be transmitted through aperture 422 to be detected by light sensor 402. Light transmitted through aperture 422 and incident on light sensor 402 may be referred to as "signal" light because it may provide information about features within the environment (e.g., based on time of flight of the light emitted by the light source of the LIDAR).

However, light sensor 402 may also detect noise light and other electromagnetic radiation, thus producing inaccurate measurements. For example, light 412 incident on the top surface of PCB 400 may be transmitted from the top side of PCB 400 to the bottom side of PCB 400 by way of regions 416a and 416b of the PCB substrate material (i.e., dielectric material). Light 412 may subsequently reflect off of enclosure 414 or another reflective surface and strike light sensor 402, thus producing a false reading. The magnitude of the problem may be compounded because light sensor 402 may be very sensitive, allowing for the detection of even a single photon. Light sensor 402 may be or may include, for example, PhotoMultiplier Tubes (PMT), Avalanche Photo-Diodes (APD), Silicon PhotoMultipliers (SiPM), PIN Diodes, complementary metal oxide semiconductor (CMOS) sensors, and charge coupled device (CCD) sensors. Thus, even very small amounts of noise light (e.g., several photons) may significantly interfere with the signal light received through aperture 422.

Figure 5A:
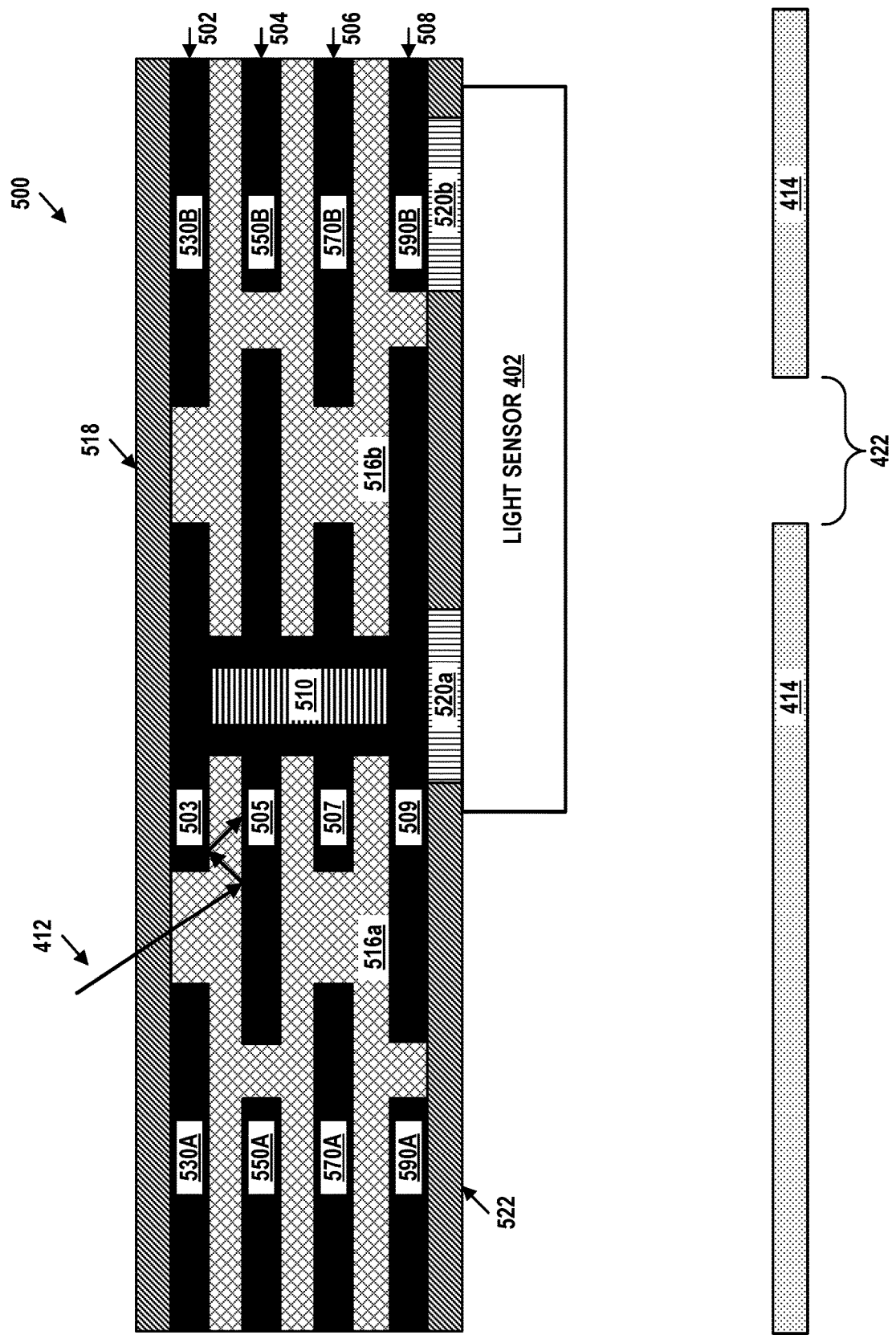
FIG. 5A illustrates a lateral cross-sectional view of a Printed Circuit Board with nonuniform via pads, according to an example embodiment.

FIG. 5A illustrates a lateral cross-section of another example PCB 500. Similarly to PCB 400 shown in FIG. 4, PCB 500 includes metal layers 502, 504, 506, and 508, top solder mask 518, bottom solder mask 522, via 510, light sensor 402 connected to PCB 500 by way of solder pads 520a and 520b. The metal layers may include various metallic features 530A, 530B, 550A, 550B, 570A, 570B, 590A, and 590B (i.e., metallic features 530A-590B). However, whereas the catch pads 403, 405, 407, and 409 of PCB 400 all have approximately the same size, catch pads catch pads 503, 505, 507, and 509 of PCB 500 are nonuniform.

In particular, the size of catch pads 505 and 509 is greater than the size of catch pads 503 and 507. Thus, catch pads 505 and 509 extend through regions 516a and 516b of the PCB substrate and horizontally overlap with other metallic features 530A, 530B, 570A, and 570B in adjacent metal layers 502 and 506. Accordingly, whereas regions 416a and 416b of PCB 400 provide a direct transmission path for light 412, the nonuniform sizing of catch pads 503, 505, 507, and 509 of PCB 500 provides an obstruction to the direct transmission of light 412 through regions 516a and 516b, thereby reducing the probability that noise light incident on the top side of PCB 500 will be transmitted to the bottom side of PCB 500 and reach light sensor 402. As a result of the reduced probability of transmission of the light, the amount or proportion of the noise light incident on the top side of PCB 500 that ends up transmitted to the bottom side of PCB 500 is also reduced.

In one example, catch pads 503 and 507 may be annular rings having an outer diameter of 15 mils (i.e., thousandths of an inch) and catch pads 505 and 509 may be annular rings having an outer diameter of 35 mils. Thus, the diameter of the larger catch pads may be more than twice the outer diameter of the smaller catch pads. The inner diameter of catch pads 503, 505, 507, and 509, as well as the outer diameter of via 510, may be 5 mils.

Further, in addition to spanning regions 516a and 516b, catch pad 505 may horizontally overlap with a plurality of metallic features in metal layers 502 and 506. Similarly, in addition to spanning regions 516a and 516b, catch pad 509 may horizontally overlap with a plurality of metallic features in metal layer 506. Metallic features 550A, 550B, 590A, and 590B in layers 504 and 508 may be rearranged to accommodate the increased size of catch pads 505 and 509, respectively. In some embodiments, metallic features 530A, 530B, 570A, and 570B in layers 502 and 506 may also be rearranged to ensure that, at every point along the horizontal extent of PCB substrate regions 516a and 516b, there is overlap between at least one of catch pads 505 or 509 and at least one metallic feature in layers 502 or 506.

When PCB 500 is viewed from the top or the bottom, this overlap may result in the PCB substrate regions 516a and 516b being spanned at all points by at least one metal layer. That is, the non-uniformity of catch pads 503, 505, 507, and 509 may have the effect of masking or shielding all dielectric substrate regions (e.g., 416a and 416b) by way of which light could directly pass through PCB 500.

Although some light may still make its way through PCB 500 by following an indirect zigzag path between the overlapping metallic features, the nonuniform sizing of catch pads 503, 505, 507, and 509 reduces the probability of this happening by creating a more tortuous path (e.g., longer, including more reflections, etc.) that the light will have to take to be transmitted from the top side of PCB 500 to the bottom side of PCB 500. Instead, light 412 is more likely to be reflected back out of PCB 500 or be internally absorbed by the metal layers of PCB 500. The difference in size between catch pads 503, 505, 507, and 509 may be adjusted to further reduce the probability of light 412 being transmitted through PCB 500. Similarly, the extent to which the nonuniform catch pads overlap horizontally with metallic features in adjacent layers may be increased to further reduce the probability of light transmission. The reduced probability of transmission of light 412 through PCB 500 thus results in a reduction in the amount or proportion of light incident on the top of PCB 500 that ends up transmitted through regions 516a and 516b to the bottom of PCB 500.

The extent of optical isolation between the first and second sides of PCB may be further improved by filling (i.e., depositing material into the cavity of) or tenting (i.e., depositing material over the top of) via 510. Specifically, via 510 may be filled or tented with metal or another optically non-transmissive material to prevent transmission of light through the barrel (e.g., the center cavity or bore) of the via.

Further, in some embodiments, the extent of optical isolation may also be improved by using a dark (e.g., black) solder mask instead of a light (e.g., green) solder mask. The dark solder mask may absorb radiation in the relevant portion of the electromagnetic spectrum, thus obstructing transmission of light through the PCB. Notably, the minimum allowable feature size of a dark solder mask may be larger than the minimum allowable feature size of a light solder mask. Thus, a dark solder mask may be appropriate in some application or some regions of a PCB that meet the minimum size (e.g., pitch) requirement.

Notably, although the overlap of catch pads 505 and 509 with metallic features in adjacent metal layers 502 and 506 is described as "horizontal," it is to be understood that the term "horizontal" is intended to encompass changes in the direction of overlap resulting from rotation of PCB 500. Thus, the horizontal overlap may be considered horizontal with respect to a horizontal plane of PCB 500 as illustrated in FIG. 5A. Accordingly, if PCB 500 is rotated by 90 degrees from the orientation shown in FIG. 5A, the overlap of catch pads 505 and 509 with metal layers 502 and 508 will remain horizontal with respect to the horizontal plane of PCB 500.

Figure 5B:
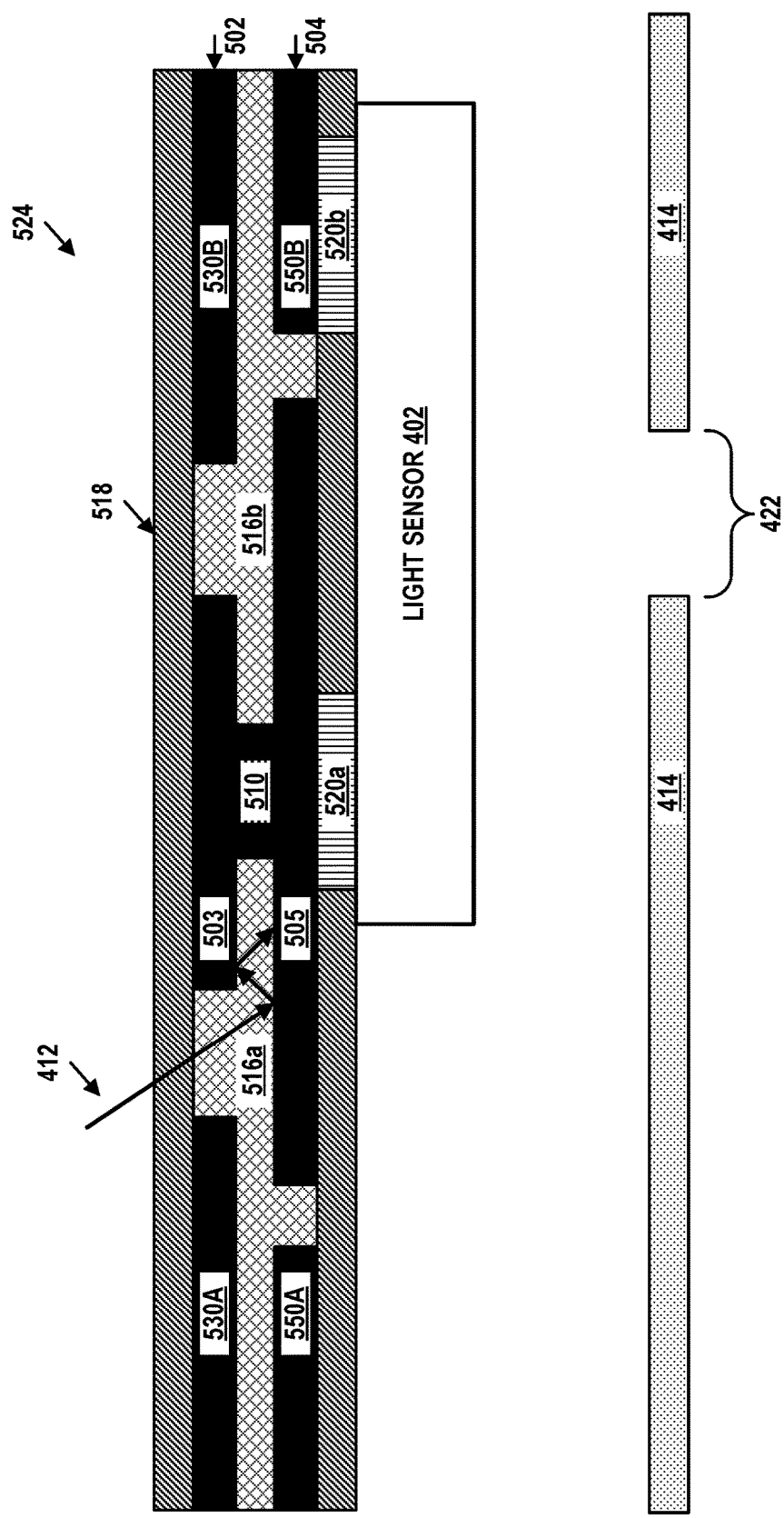
FIG. 5B illustrates a lateral cross-sectional view of another Printed Circuit Board with nonuniform via pads, according to an example embodiment.

Additionally, although FIG. 5A illustrates a PCB with four metal layers, the nonuniform via catch pads may also be used with PCBs having more or fewer metal layers. In particular, FIG. 5B illustrates a lateral cross-section of PCB 524 which includes only two metal layers 502 and 504 (i.e., PCB 500 with metal layers 506 and 508 removed). Thus, via 510 includes only two catch pads 503 and 505. The size of catch pad 505 is greater than the size of catch pad 503. Catch pad 505 overlaps with metallic features in metal layer 502 to provide an obstruction to the transmission of light 412 through regions 516a and 516b of PCB 524. In particular, catch pad 505 may overlap with a plurality of metallic features in layer 502 such that, when viewed from the top, all points along the area of PCB 524 are spanned by at least one metallic feature to provide an obstruction to the transmission of light through PCB 524.

In some embodiments, catch pad 505 might extend through the dielectric regions 516a and 516b without overlapping with metallic features 530A and 530B in metal layer 502. Nevertheless, by spanning the dielectric regions 516a and 516b, catch pad 505 might help ensure that all points along the area of PCB 524 are spanned by at least one metallic feature and thus provide an obstruction to the transmission of light through PCB 524.

In some embodiments, a PCB may have more than four metal layers. Such a PCB may include, for example three instances of layers 502 and 504 stacked on top of one another for a total of six layers. The six-layered PCB may thus include three metal layers each including a corresponding via catch pad having a first size (e.g., the size of catch pad 503). The six-layered PCB may also include three metal layers each including a corresponding via catch pad having a second size larger than the first size (e.g., the size of catch pad 505). In other embodiments, the PCB may include an arbitrary number of layers as needed to define the electrical connectivity of the PCB. Further, the relative sizes of the via catch pads in the different layers may be varied as needed to accommodate all requisite metallic features of the PCB, provided that dielectric regions 516a and 516b are obstructed by at least one catch pad.

Figure 5C:
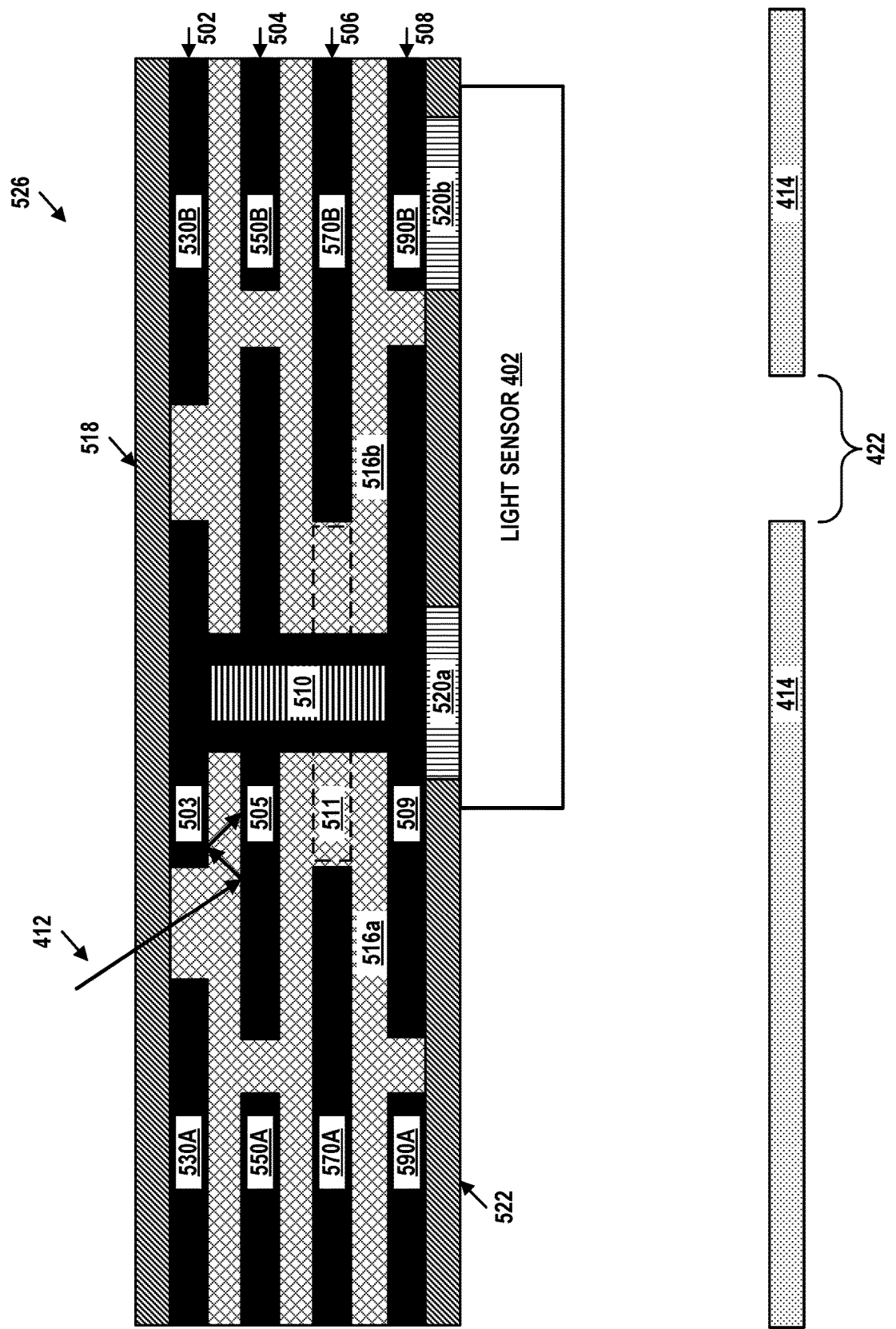
FIG. 5C illustrates a lateral cross-sectional view of a further Printed Circuit Board with nonuniform via pads, according to an example embodiment.

In some embodiments, the nonuniform via catch pads may also include via anti-pads. FIG. 5C illustrates a lateral cross-section of PCB 526 which includes a via anti-pad 511 in metal layer 506. An anti-pad is a space around the via within a metal layer providing clearance between the via and other metallic features within the metal layer. The anti-pad isolates the via from metallic features within a corresponding metal layer (i.e., metallic features that are part of a different electrical net and are not intended to be in electrical contact with the via) and thus reduces the likelihood of inadvertent electrical connections and flashovers (e.g., electrical connections via an air gap). Anti-pad 511, indicated by the dashed line, is the space about via 510 that provides a clearance between via 510 and metallic features 570A and 570B within metal layer 506. Due to the additional space provided by anti-pad 511 in PCB 526 relative to the catch pad 507 in PCB 500, the metallic features 570A and 570B in metal layer 506 may be routed closer to via 510, thus increasing the extent of overlap of catch pads 505 and 509 with metallic features 570A and 570B in metal layer 506.

The layout of the metallic features within a layer of a PCB may be determined to improve or maximize the optical shielding provided by the metallic features of the PCB. For example, as illustrated in FIG. 5C, a PCB layout may be determined such that via anti-pads are positioned within a metal layer between two large via catch pads (e.g., catch pads 505 and 509). In another example, the metallic features within layers of the PCB may be routed in a manner ensuring that all points along the area of the PCB, when viewed from the top, contain a metallic feature in at least one layer of the PCB, thus obstructing the direct transmission of light across the entire area of the PCB. Further, the metallic features may be routed in a manner ensuring that there is at least a minimum extent of overlap between a metallic feature in a first metal layer and another metallic feature in another metal layer of the PCB, thus ensuring at least a minimum number of reflections that a photon would have to undergo to be transmitted between the two sides of the PCB.

Such design parameters may be implemented as a Design Rule Check (DRC) in a PCB design software. The DRC may identify and indicate regions or features of the PCB that violate the design parameter (e.g., no direct light transmission paths), thus allowing a designer to reroute any features that violate the rule in order to correct the violation. In some embodiments, the PCB design software may be configured to automatically route or reroute metallic features to satisfy the design rules herein described.

Figure 6A:
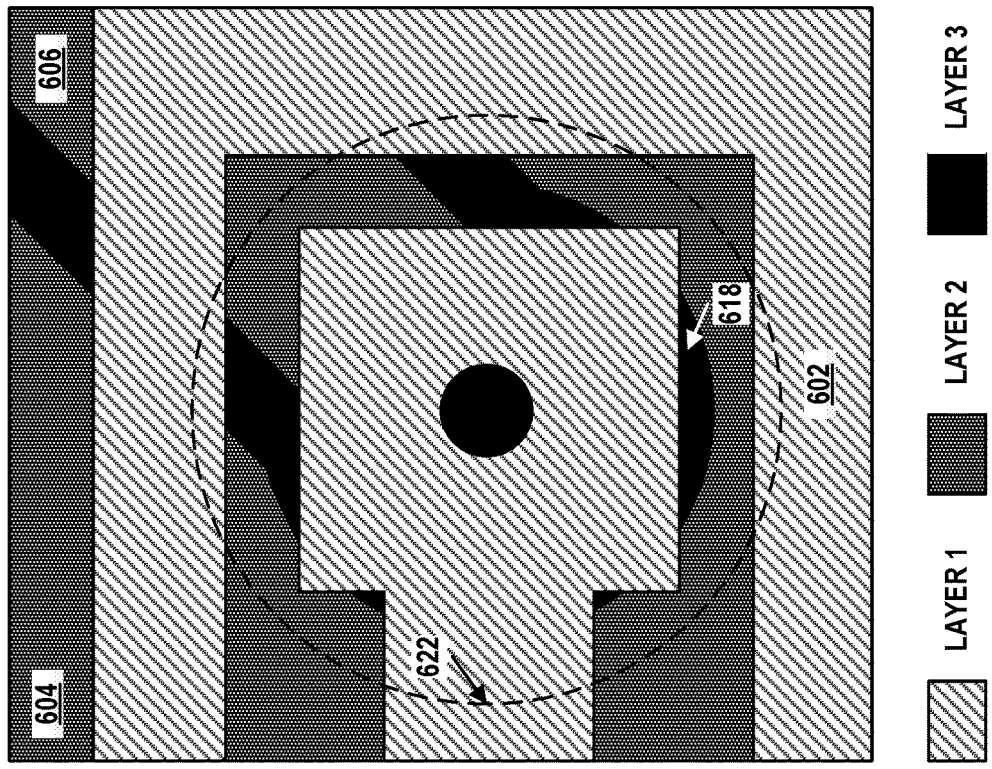
FIG. 6A illustrates a top view of a Printed Circuit Board with uniform via pads, according to an example embodiment.
Figure 6B:
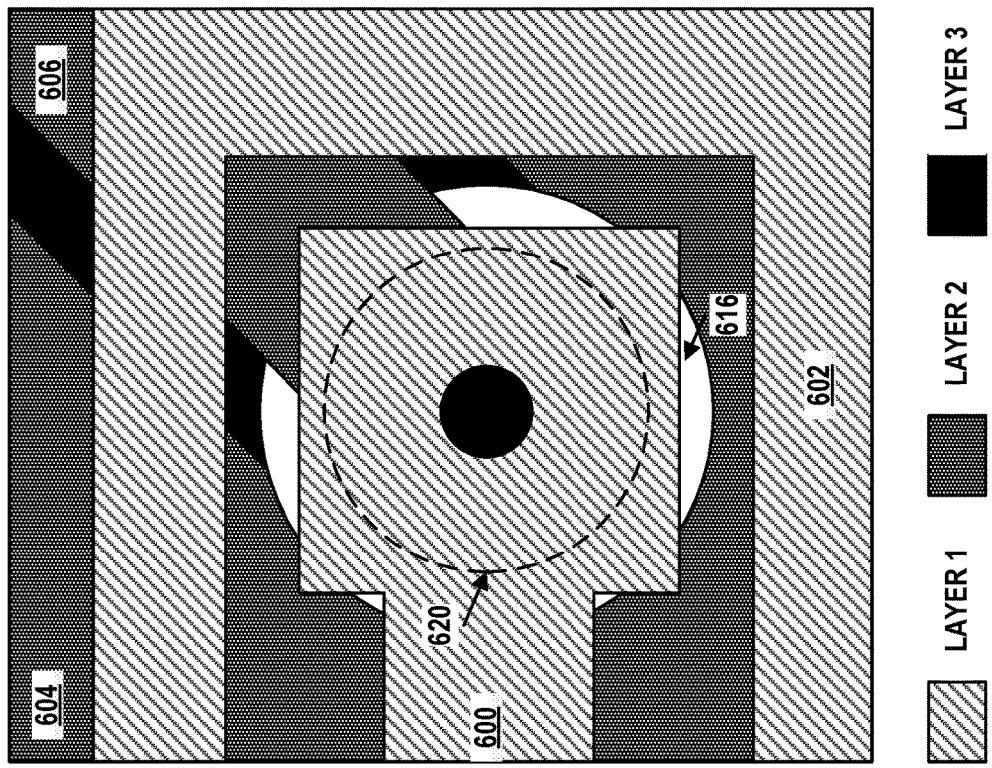
FIG. 6B illustrates a top view of a Printed Circuit Board with nonuniform via pads, according to an example embodiment.

FIGS. 6A and 6B illustrate a top view of a region of a three-layered PCB with uniform catch pads and nonuniform catch pads, respectively. In particular, FIG. 6A illustrates the transmissive region that may result when uniform via catch pads are used. In layer 1, the PCB includes solder pad 600 and a metal trace 602. A via is positioned below solder pad 600 and spans layers 1-3. The size of the via catch pads in layers 1-3 is indicated by dashed line 620. In layer 2, the PCB includes metal plane 604 and metal trace 606 which connects to a corresponding via catch pad in layer 2. Metallic features of layer 3 are visible through the clearance spacing between metal plane 604 and metal trace 606.

When all via catch pads are uniform, as shown in FIG. 6A, the spacing between the via catch pads and adjacent metallic features within corresponding metal layers results in a transmissive region 616 of the PCB substrate (i.e., a region that does not contain any metallic features in layers 1-3, as indicated by the white space about pad 600). Thus, light incident on the top of the PCB in region 616 may be transmitted through region 616 to the bottom of the PCB, potentially striking any light-sensitive elements positioned thereabout.

In contrast, when the via catch pad in layer 3 of the PCB is increased in size, as illustrated in FIG. 6B by dashed line 622, the via catch pad extends through the transmissive region 616 and underneath metal plane 604 and metal trace 606 in layer 2. The catch pad in layer 3 thus creates an obstruction 618 that blocks direct transmission of light through the previously transmissive region 616. Since the catch pad in layer 2, as shown in FIG. 6B, remains the same size as in FIG. 6A, metal plane 604 and trace 606 retain their original positioning relative to the catch pad and thus overlap with the now-larger catch pad in layer 3. Accordingly, the nonuniform via catch pads operate to obstruct any direct transmission paths around the via by extending at least one of the metal catch pads into the direct transmission paths.

The nonuniform catch pads, as well as the other techniques herein disclosed, may also be used in an IC device. For example, FIG. 5A may represent a cross-section of an IC device that includes therein additional active electronic components (not shown, e.g., transistors) configured to implement a desired functionality of the IC (e.g., processing a signal from a sensor). In some implementations, light sensor 402 may form part of the IC and may be exposed to the environment such that light may reach sensor 402. As previously described, the nonuniform catch pads 503, 505, 507, and 509 may obstruct transmission of light through otherwise transmissive regions 516a and 516b of the IC, thus shielding light sensor 402 from being struck by light incident on the top side of the IC. The various structures herein described (e.g., vias, traces, catch pads, metal planes, active components) may be created on a silicon substrate to form the IC using corresponding IC manufacturing techniques (e.g., photolithography, doping, metallization, etching, chemical vapor deposition, ion implantation, passivation, encapsulation, etc.) and materials (e.g., silicon, boron, aluminum, phosphorus, arsenic, etc.).

V. EXAMPLE LIDAR DEVICE WITH PCB HAVING OPTICAL ISOLATION

Figure 7:
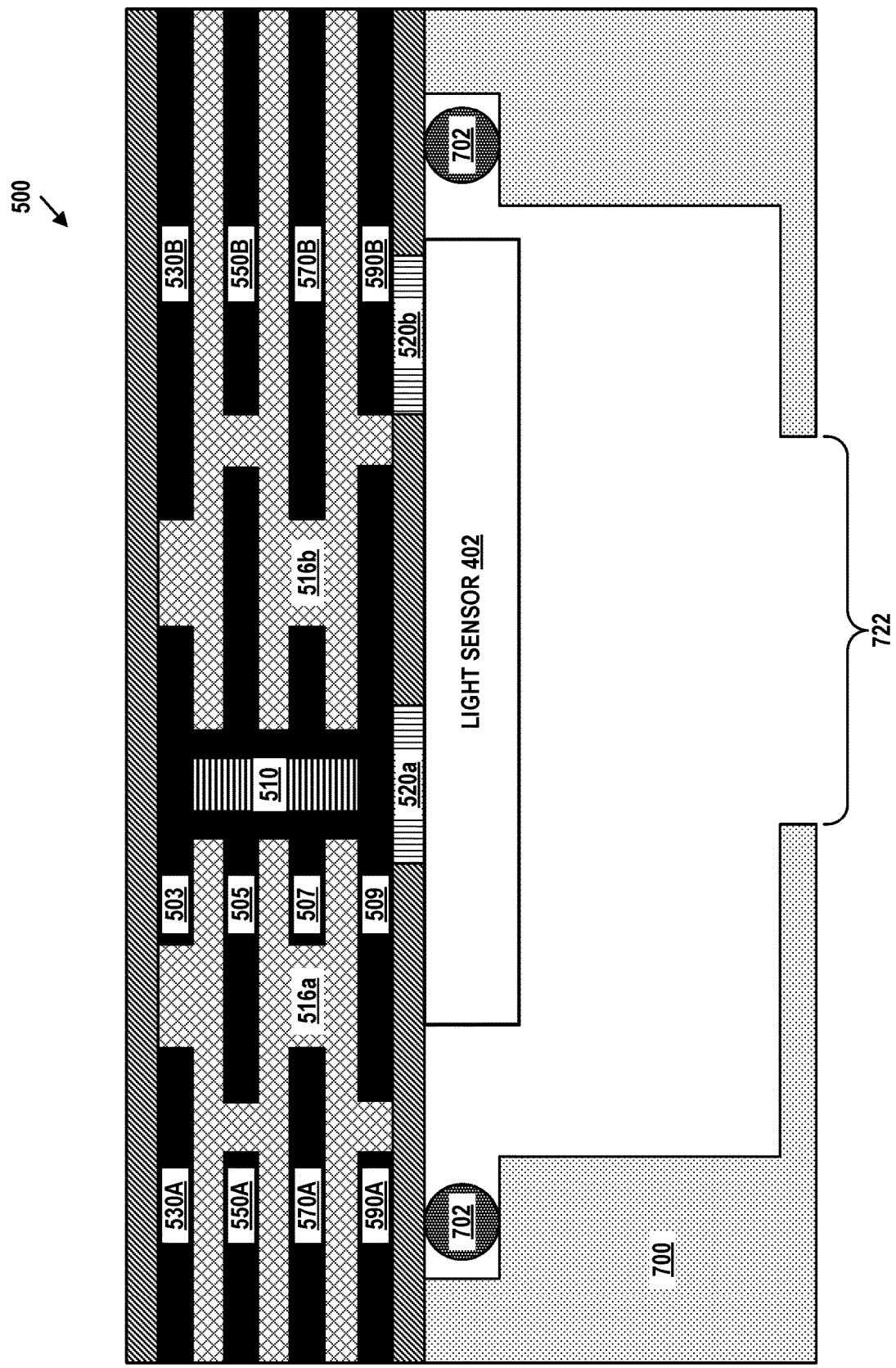
FIG. 7 illustrates a light sensor housed within an enclosure, according to an example embodiment.

FIG. 7 illustrates a lateral cross-section of PCB 500 assembled with enclosure 700 surrounding light sensor 402. The assembly illustrated in FIG. 7 may form part of a LIDAR device and may be positioned within a housing thereof. The LIDAR device, or a plurality thereof, may be connected to various parts or portions of a vehicle to allow the vehicle to navigate based on a signal from the LIDAR. Light sensor 402 of the LIDAR device may include very sensitive elements such as PhotoMultiplier Tubes (PMT), Avalanche PhotoDiodes (APD), Silicon PhotoMultipliers (SiPM), or PIN diodes that, working in conjunction with an amplifier circuit, allow the detection of even just a single photon. Thus, it may be advantageous to shield light sensor 402 from stray photons that could cause unwanted triggering of light sensor 402.

Accordingly, enclosure 700 includes an aperture 722 through which light from an environment may be selectively directed at light sensor 402. The assembly also includes a gasket 702 positioned between enclosure 700 and the bottom of PCB 500 to optically isolate the light sensor 402. In particular, gasket 702 obstructs light incident on the interface between enclosure 700 and PCB 500 from reaching light sensor 402. Further, PCB includes nonuniform catch pads, as discussed with respect to FIG. 5A, that obstruct unwanted light incident on the top of PCB 500 from transmission through regions 516a and 516b to the bottom of PCB 500 and triggering of light sensor 402.

PCB 500 and enclosure 700 may be rotated or otherwise repositioned to selectively direct light from an environment onto light sensor 402. For example, PCB 500 and enclosure 700 may be rotated along with the LIDAR device, which includes a light source, to map out an environment of the LIDAR device. In particular, light sensor 402 may be used to map out the environment based on time of flight of light emitted by the light source of the LIDAR device. Aperture 722 may be used to selectively limit the light reaching light sensor 402 to light containing the optical signal emitted by the light source and reflected back at the light sensor 402 from a feature within the environment. The nonuniform catch pads 503, 505, 507, and 509, enclosure 700, and gasket 702 may, in combination, reduce the amount of noise light (i.e., light that has not been emitted by the light source of the LIDAR device) reaching light sensor 402, thus improving the accuracy of the LIDAR device in mapping out an environment.

VI. EXAMPLE METHOD OF MANUFACTURING A PCB WITH OPTICAL ISOLATION

Figure 8:
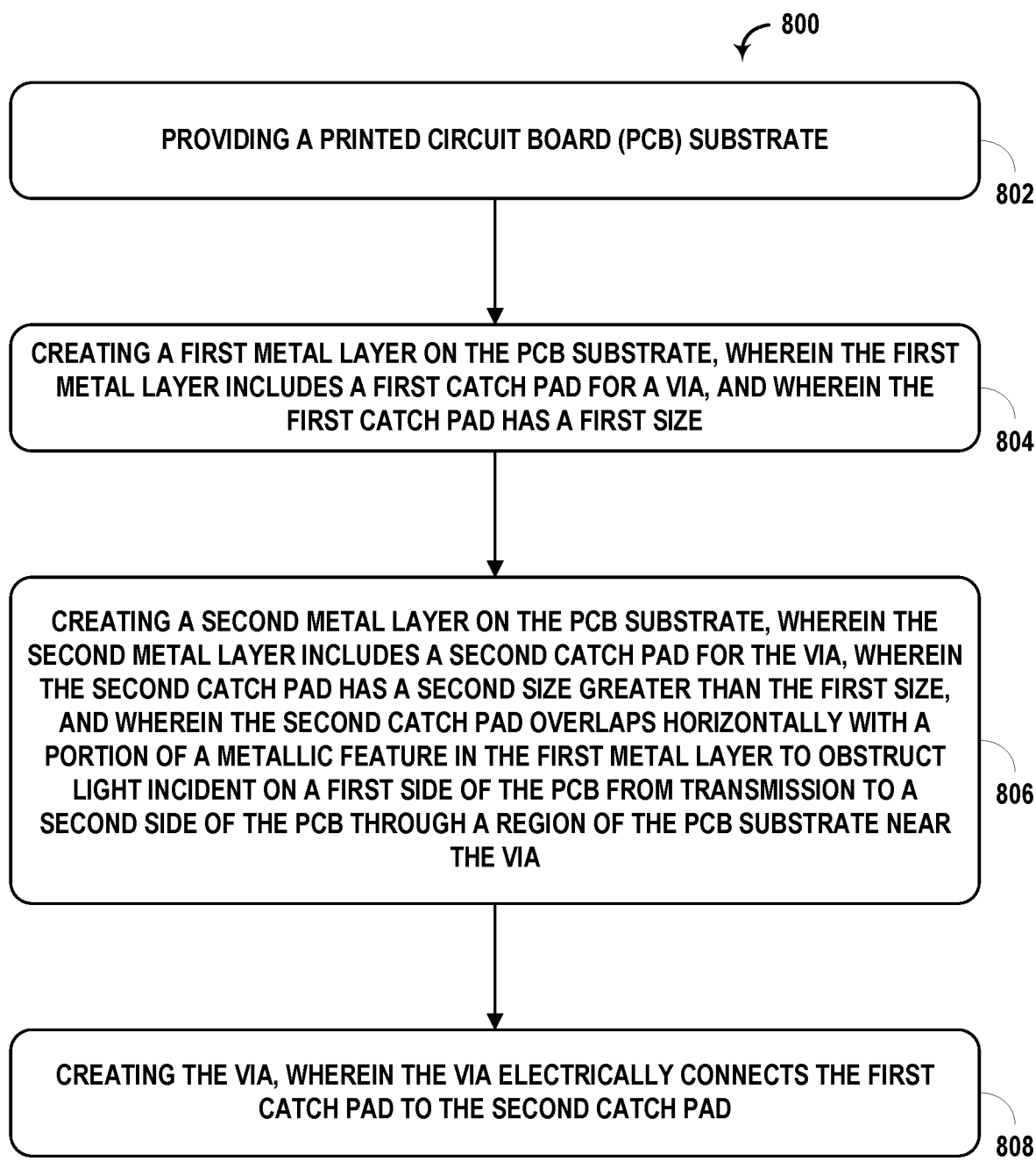
FIG. 8 illustrates example operations for manufacturing a printed circuit board, according to an example embodiment.

FIG. 8 illustrates an example flow chart 800 of operations for manufacturing a PCB that includes nonuniform catch pads. The operations of flow chart 800 may be performed manually, automatically (e.g., by a robotic device), or using a combination of manual and automated processes. The operations of flow chart 800 may be used to manufacture, for example, PCB 500, PCB 524, or PCB 526, illustrated in FIGS. 5A, 5B, and 5C, respectively.

In block 802, a Printed Circuit Board (PCB) substrate may be provided. The material of the PCB substrate may be chosen to provide the desired dielectric constant, tensile strength, shear strength, glass transition temperature, and expansion coefficient, among other properties. The PCB substrate may include, for example, polytetrafluoroethylene, FR-2 (phenolic cotton paper), FR-3 (cotton paper and epoxy), FR-4 (woven glass and epoxy), FR-5 (woven glass and epoxy), FR-6 (matte glass and polyester), G-10 (woven glass and epoxy), CEM-1 (cotton paper and epoxy), CEM-2 (cotton paper and epoxy), CEM-3 (non-woven glass and epoxy), CEM-4 (woven glass and epoxy), CEM-5 (woven glass and polyester), or ceramics (e.g., Aluminum Oxide (Al2O3) or Aluminum Nitride (AlN)), among other possibilities. Further, in some example, the PCB substrate may be a flexible PCB substrate (e.g., a polyimide substrate).

In block 804, a first metal layer may be created on the PCB substrate. The first metal layer may include a first catch pad for a via. The first catch pad may have a first size. The first metal layer may also include a plurality of other metallic features, including pads, traces, and planes necessary to implement the desired electrical connectivity of the PCB.

Creating the first metal layer and the features thereof may include starting with a metal-clad PCB substrate. Alternatively, an adhesive-backed sheet or film of metal may be bonded to a PCB substrate. A photoresist may be applied to the metal layer. The photoresist may then be exposed through a mask and subsequently developed (i.e., exposed to UV light to polymerize the photoresist) to protect metal regions defining the desired features. The unprotected metal regions may be etched and the protective photoresist may be removed to reveal the metallic features.

In block 806, a second metal layer may be created on the PCB substrate. The second metal layer may include a second catch pad for the via. The second catch pad may have a second size greater than the first size and may overlap horizontally with a portion of a metallic feature in the first metal layer to obstruct light incident on a first side of the PCB from transmission to a second side of the PCB through a region of the PCB substrate near the via. Like the first metal layer, the second metal layer may also include a plurality of other metallic features necessary to implement the desired electrical connectivity of the PCB.

In block 808, the via may be created. The via may electrically connect the first catch pad to the second catch pad, thereby providing an electrical connection between the first and second metal layers of the PCB. The via may be created by drilling through a portion (e.g., center portion) of each of the first and second catch pads of the PCB. Photoresist may be applied, exposed through a mask, and developed to protect all regions where metal deposition is not desired. Thus, the barrel (i.e., bore) of the via may be left unprotected and metal may be deposited along the barrel to electrically connect the first and second catch pads. The volume of the via may then be filled with metal or filled with a nonconductive material and plated over by a metal layer (e.g., via in pad). The volume of the via may be filled or plated over to prevent transmission of light between the two sides of the PCB by way of the via.

In some instances, the entire via may be drilled and filled in one step (e.g., a through-hole via). Alternatively, the via may be drilled and filled in multiple steps. A stacked microvia, for example, may be built up sequentially by fabricating a portion of the stacked microvia each time a metal layer is created on the PCB substrate. Specifically, the operations of laser drilling, metal deposition, and filling of the via may be repeated for each metal layer to build up the microvia stack.

A multilayer PCB may be manufactured by providing additional PCB substrate layers and depositing additional metal layers thereon. The additional metal layers may include catch pads of the first size, the second size, or another larger or smaller size, as needed to obstruct transmission of light through regions of the PCB substrate around the via. Additionally, other known PCB manufacturing techniques may be used in addition to or instead of the techniques herein described in order to create the PCB layers and features therein. The manufacturing processes used may depend on the type of via desired or the size of the PCB components, among other factors.

VII. CONCLUSION

The present disclosure is not to be limited in terms of the particular embodiments described in this application, which are intended as illustrations of various aspects. Many modifications and variations can be made without departing from its scope, as will be apparent to those skilled in the art. Functionally equivalent methods and apparatuses within the scope of the disclosure, in addition to those enumerated herein, will be apparent to those skilled in the art from the foregoing descriptions. Such modifications and variations are intended to fall within the scope of the appended claims.

The above detailed description describes various features and functions of the disclosed systems, devices, and methods with reference to the accompanying figures. The example embodiments described herein and in the figures are not meant to be limiting. Other embodiments can be utilized, and other changes can be made, without departing from the spirit or scope of the subject matter presented herein. It will be readily understood that the aspects of the present disclosure, as generally described herein, and illustrated in the figures, can be arranged, substituted, combined, separated, and designed in a wide variety of different configurations, all of which are explicitly contemplated herein.

A block that represents a processing of information may correspond to circuitry that can be configured to perform the specific logical functions of a herein-described method or technique. Alternatively or additionally, a block that represents a processing of information may correspond to a module, a segment, or a portion of program code (including related data). The program code may include one or more instructions executable by a processor for implementing specific logical functions or actions in the method or technique. The program code and/or related data may be stored on any type of computer readable medium such as a storage device including a disk or hard drive or other storage medium.

The computer readable medium may also include non-transitory computer readable media such as computer-readable media that stores data for short periods of time like register memory, processor cache, and random access memory (RAM). The computer readable media may also include non-transitory computer readable media that stores program code and/or data for longer periods of time, such as secondary or persistent long term storage, like read only memory (ROM), optical or magnetic disks, compact-disc read only memory (CD-ROM), for example. The computer readable media may also be any other volatile or non-volatile storage systems. A computer readable medium may be considered a computer readable storage medium, for example, or a tangible storage device.

Moreover, a block that represents one or more information transmissions may correspond to information transmissions between software and/or hardware modules in the same physical device. However, other information transmissions may be between software modules and/or hardware modules in different physical devices.

The particular arrangements shown in the figures should not be viewed as limiting. It should be understood that other embodiments can include more or less of each element shown in a given figure. Further, some of the illustrated elements can be combined or omitted. Yet further, an example embodiment can include elements that are not illustrated in the figures.

Additionally, any enumeration of elements, blocks, or steps in this specification or the claims is for purposes of clarity. Thus, such enumeration should not be interpreted to require or imply that these elements, blocks, or steps adhere to a particular arrangement or are carried out in a particular order.

While various aspects and embodiments have been disclosed herein, other aspects and embodiments will be apparent to those skilled in the art. The various aspects and embodiments disclosed herein are for purposes of illustration and are not intended to be limiting, with the true scope being indicated by the following claims.

What is claimed is:

1. An apparatus comprising:
   a printed circuit board (PCB) including a first side and a second side;
   an enclosure connected to the second side of the PCB and comprising;
   a light sensor connected to the second side of the PCB, disposed within the enclosure, and configured to sense light incident on the light sensor through the aperture; and
   a gasket material disposed between the PCB and the enclosure and forming an optically isolating interface therebetween, wherein the PCB comprises:
      a first metal layer comprising a first plurality of metallic features that includes a first catch pad connected to a via; and
      a second metal layer comprising a second plurality of metallic features that includes a second catch pad connected to the via, wherein each respective metallic feature of the second plurality of metallic features overlaps horizontally with corresponding one or more metallic features of the first plurality of metallic features, and wherein, by overlapping horizontally with the corresponding one or more metallic features in the first metal layer, each respective metallic feature in the second metal layer is configured to obstruct light incident on the first side of the PCB from transmission through corresponding dielectric material regions of the PCB to the light sensor connected to the second side of the PCB.

2. The apparatus of claim 1, wherein the first plurality of metallic features and the second plurality of metallic features are routed such that, at all points along a horizontal area of the PCB, at least one metal layer contains a metallic feature that obstructs light from transmission through the corresponding dielectric material regions.

3. The apparatus of claim 1, wherein the PCB comprises:
   the via extending between the first metal layer and the second metal layer, wherein the first catch pad has a first size, and wherein the second catch pad has a second size greater than the first size.

4. The apparatus of claim 1, wherein the PCB forms part of a Light Detection and Ranging (LIDAR) system.

5. The apparatus of claim 1, wherein the light sensor comprises a single-photon light sensor.

6. The apparatus of claim 1, wherein the horizontal overlap between each respective metallic feature of the second plurality of metallic features and the corresponding one or more metallic features of the first plurality of metallic features is associated with at least a minimum number of reflections of a photon such that the photon is, prior to transmission of the photon through the PCB, reflected out of the PCB or absorbed by metallic features of the PCB.

7. The apparatus of claim 1, wherein, for each respective metallic feature of the second plurality of metallic features, the corresponding one or more metallic features in the first metal layer are routed to completely overlap an outer boundary of the respective metallic feature of the second plurality of metallic features.

8. The apparatus of claim 3, wherein the corresponding one or more metallic features with which the second catch pad overlaps horizontally comprise a first metallic feature different from the first catch pad and located in a different horizontal position than the first catch pad.

9. The apparatus of claim 3, wherein the PCB further comprises a third metal layer comprising a third plurality of metallic features, and wherein the first plurality of metallic features and the third plurality of metallic features are routed to create continuous horizontal overlap with an outer boundary of the second catch pad.

10. The apparatus of claim 3, wherein the PCB further comprises a third metal layer comprising a third plurality of metallic features that includes a third catch pad connected to the via and having a third size smaller than the second size, wherein the second metal layer is positioned between the first metal layer and the third metal layer, wherein the second catch pad interposes horizontally between the corresponding one or more metallic features of the first plurality of metallic features and corresponding one or more additional metallic features of the third plurality of metallic features.

11. The apparatus of claim 4, wherein the enclosure is disposed within a housing of the LIDAR system.

12. An apparatus comprising:
a printed circuit board (PCB) including a first side and a second side;
an enclosure connected to the second side of the PCB and comprising an aperture;
a light sensor connected to the second side of the PCB, disposed within the enclosure, and configured to sense light incident on the light sensor through the aperture; and
a gasket material disposed between the PCB and the enclosure and forming an optically isolating interface therebetween, wherein the PCB comprises:
a first metal layer comprising a first plurality of metallic features that includes a first catch pad connected to a via; and
a second metal layer comprising a second plurality of metallic features that includes a second catch pad connected to the via, wherein one or more metallic features of the second plurality of metallic features overlap horizontally with corresponding one or more metallic features of the first plurality of metallic features, and wherein, at all points along a horizontal area of the PCB, at least one metal layer of the PCB contains a metallic feature to block photons incident on the first side of the PCB from transmission through corresponding dielectric material regions of the PCB to the second side of the PCB.

13. The apparatus of claim 12, wherein the one or more metallic features of the second plurality of metallic features comprise the second catch pad, wherein the corresponding one or more metallic features with which the second catch pad overlaps horizontally comprise a first metallic feature different from the first catch pad and located in a different horizontal position than the first catch pad.

14. The apparatus of claim 12, wherein the PCB further comprises a third metal layer comprising a third plurality of metallic features, and wherein the first plurality of metallic features and the third plurality of metallic features are routed to create continuous horizontal overlap with an outer boundary of the second catch pad.

15. The apparatus of claim 12, wherein the PCB further comprises a third metal layer comprising a third plurality of metallic features that includes a third catch pad connected to the via, wherein the second metal layer is positioned between the first metal layer and the third metal layer, wherein the second catch pad interposes horizontally between the corresponding one or more metallic features of the first plurality of metallic features corresponding one or more additional metallic features of the third plurality of metallic features.

16. An apparatus comprising:
a printed circuit board (PCB) including a first side and a second side;
an enclosure connected to the second side of the PCB and comprising;
a light sensor connected to the second side of the PCB, disposed within the enclosure, and configured to sense light incident on the light sensor through the aperture; and
an optically isolating interface formed between the PCB and the enclosure by a gasket material disposed therebetween, wherein the PCB comprises:
a first metal layer comprising a first plurality of metallic features that includes a first via catch pad; and
a second metal layer comprising a second plurality of metallic features that includes a second via catch pad, wherein a particular metallic feature of the second plurality of metallic features overlaps horizontally with corresponding one or more metallic features in the first metal layer, wherein the corresponding one or more metallic features in the first metal layer are routed to completely overlap an outer boundary of the particular metallic feature such that light incident on the first side of the PCB is obstructed from reaching the light sensor by way of a corresponding dielectric material region of the PCB.

17. The apparatus of claim 16, wherein the horizontal overlap of the particular metallic feature with the corresponding one or more metallic features in the first metal layer is associated with at least a minimum number of reflections of a photon such that the photon is, prior to transmission of the photon through the PCB, reflected out of the PCB or absorbed by metallic features of the PCB.

18. The apparatus of claim 16, wherein the first plurality of metallic features and the second plurality of metallic features are routed such that, at all points along a horizontal area of the PCB, at least one of the first metal layer or the second metal layer contains a metallic feature that obstructs light from transmission through the PCB.

19. The apparatus of claim 16, wherein the PCB comprises:
a via extending between the first metal layer and the second metal layer, wherein the first via catch pad is connected to the via and has a first size, and wherein the second via catch pad is connected to the via and has a second size greater than the first size.

20. The apparatus of claim 19, wherein the second via catch pad overlaps horizontally with at least one metallic feature of the first plurality of metallic features, and wherein the at least one metallic feature comprises a first metallic feature different from the first via catch pad and located in a different horizontal position than the first via catch pad.

* * * * *